(12) United States Patent
Gu et al.

(10) Patent No.: US 10,840,307 B2
(45) Date of Patent: Nov. 17, 2020

(54) SUBPIXEL ARRANGEMENTS OF DISPLAYS AND METHOD FOR RENDERING THE SAME

(71) Applicant: Kunshan Yunyinggu Electronic Technology Co., Ltd., Kunshan (CN)

(72) Inventors: Jing Gu, Shanghai (CN); Xixi Luo, Shanghai (CN)

(73) Assignee: KUNSHAN YUNYINGGU ELECTRONIC TECHNOLOGY CO., LTD., Kunshan (CN)

(*) Notice: Subject to any disclaimer, the term of this patent is extended or adjusted under 35 U.S.C. 154(b) by 55 days.

(21) Appl. No.: 16/157,046

(22) Filed: Oct. 10, 2018

(65) Prior Publication Data

US 2019/0081113 A1 Mar. 14, 2019

Related U.S. Application Data

(63) Continuation of application No. 14/380,201, filed as application No. PCT/CN2013/086513 on Nov. 4, 2013, now Pat. No. 10,103,205.

(51) Int. Cl.
*H01L 27/32* (2006.01)
*H01L 27/15* (2006.01)
(Continued)

(52) U.S. Cl.
CPC ....... *H01L 27/3218* (2013.01); *G09G 3/2003* (2013.01); *G09G 3/2074* (2013.01);
(Continued)

(58) Field of Classification Search
CPC ......... G09G 3/3225; G09G 2300/0426; G09G 2300/0452; G09G 2300/0465;
(Continued)

(56) References Cited

U.S. PATENT DOCUMENTS

| 5,341,153 A | 8/1994 | Benzschawel et al. |
|---|---|---|
| 7,508,126 B2 | 3/2009 | Miyagawa |

(Continued)

FOREIGN PATENT DOCUMENTS

| CN | 1329455 A | 1/2002 |
|---|---|---|
| CN | 1539129 A | 10/2004 |

(Continued)

OTHER PUBLICATIONS

First Office Action directed to related Chinese Patent Application No. 201810240452.5, dated Oct. 30, 2019; 7 pages.

(Continued)

*Primary Examiner* — Bryan Earles
(74) *Attorney, Agent, or Firm* — Bayes PLLC

(57) ABSTRACT

An apparatus including a display and control logic. In one example, the display includes an array of subpixel groups. Each of the subpixel groups includes one subpixel in a first color, two subpixels in a second color, and two subpixels in a third color. Subpixel groups in each row of the array are repeated. Subpixel groups in each row of the array are staggered relative to subpixels groups in an adjacent row of the array. The control logic is operatively coupled to the display and configured to receive display data and convert the display data into control signals for driving the array of subpixel groups.

13 Claims, 25 Drawing Sheets

(51) Int. Cl.
*G09G 3/3208* (2016.01)
*G09G 3/3225* (2016.01)
*G09G 3/20* (2006.01)

(52) U.S. Cl.
CPC ......... *G09G 3/3208* (2013.01); *G09G 3/3225* (2013.01); *H01L 27/156* (2013.01); *H01L 27/3262* (2013.01); *H01L 27/3276* (2013.01); *G09G 2300/0426* (2013.01); *G09G 2300/0452* (2013.01); *G09G 2300/0465* (2013.01); *G09G 2320/0666* (2013.01); *G09G 2340/0457* (2013.01); *H01L 27/3216* (2013.01)

(58) Field of Classification Search
CPC .... G09G 2320/0666; G09G 2340/0457; H01L 27/3218; H01L 27/3216
See application file for complete search history.

(56) References Cited

U.S. PATENT DOCUMENTS

| | | | |
|---|---|---|---|
| 9,490,446 | B2 * | 11/2016 | Lee .................. H01L 51/5209 |
| 2003/0085906 | A1 | 5/2003 | Elliott et al. |
| 2005/0248262 | A1 | 11/2005 | Brown Elliott |
| 2008/0001525 | A1 | 1/2008 | Chao et al. |
| 2009/0322215 | A1 | 12/2009 | Sung et al. |
| 2010/0156279 | A1 | 6/2010 | Tamura et al. |
| 2012/0032947 | A1 | 2/2012 | Phan et al. |
| 2012/0056531 | A1 | 3/2012 | Park et al. |
| 2012/0147065 | A1 | 6/2012 | Byun et al. |
| 2012/0194412 | A1 | 8/2012 | Kimura et al. |
| 2014/0091342 | A1 | 4/2014 | Seo |
| 2014/0197385 | A1 * | 7/2014 | Madigan ................. H01L 51/56 257/40 |
| 2015/0015466 | A1 | 1/2015 | Feng |
| 2015/0061978 | A1 | 3/2015 | Shih et al. |
| 2015/0144893 | A1 | 5/2015 | Chen |
| 2015/0208480 | A1 | 7/2015 | Hosokawa et al. |
| 2015/0364526 | A1 * | 12/2015 | Peng .................. H01L 27/3218 257/40 |
| 2016/0323965 | A1 | 11/2016 | Seki et al. |
| 2016/0343284 | A1 | 11/2016 | Sun |

FOREIGN PATENT DOCUMENTS

| | | |
|---|---|---|
| CN | 1567514 A | 1/2005 |
| CN | 1613030 A | 5/2005 |
| CN | 1737650 A | 2/2006 |
| CN | 101290761 A | 10/2008 |
| CN | 101320150 A | 12/2008 |
| CN | 101344670 A | 1/2009 |
| CN | 101393366 A | 3/2009 |
| CN | 101893792 A | 11/2010 |
| CN | 102063865 A | 5/2011 |
| CN | 102403334 A | 4/2012 |
| CN | 102479485 A | 5/2012 |
| CN | 102568376 A | 7/2012 |
| CN | 103123927 A | 5/2013 |
| CN | 103366683 A | 10/2013 |
| CN | 104885141 A | 9/2015 |
| JP | 2012028170 A | 2/2012 |
| KR | 20040096706 A | 11/2004 |
| KR | 20100001598 A | 1/2010 |
| TW | 200606769 A | 2/2006 |
| TW | 201115248 A | 5/2011 |
| WO | 2013160778 A1 | 10/2013 |

OTHER PUBLICATIONS

Written Opinion dated Aug. 13, 2014 in International Application No. PCT/CN2013/086513.
International Search Report dated Aug. 13, 2014 in International Application No. PCT/CN2013/086513.
Office Action directed to related Chinese Patent Application No. 201380059977.4, dated Sep. 2, 2016; 13 pages.
English translation of Office Action directed to related Chinese Patent Application No. 201380059977.4; 9 pages.
European Search Report directed to related European Patent Application No. 13896268.3, dated Dec. 21, 2015; 11 pages.
Extended European Search Report issued in corresponding European Application No. EP 20 15 2889, dated Jun. 19, 2020, 11 pages.

* cited by examiner

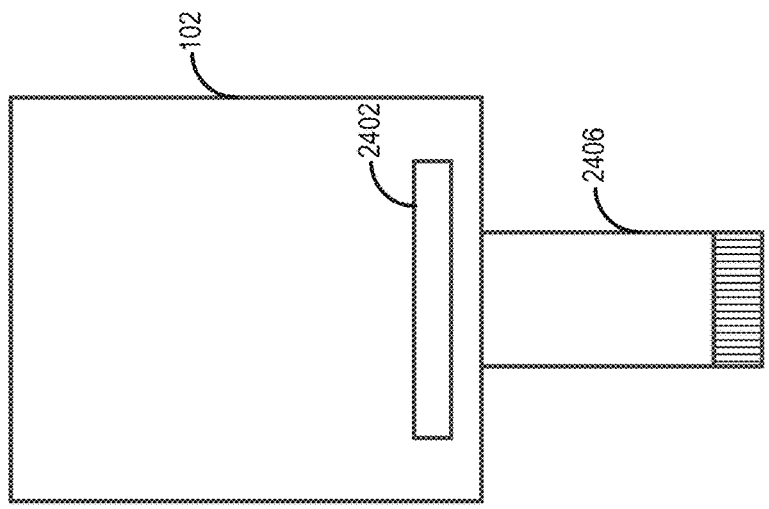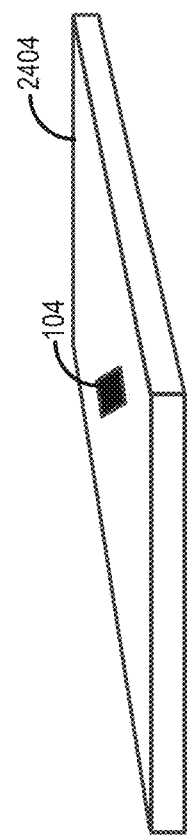
FIG. 25
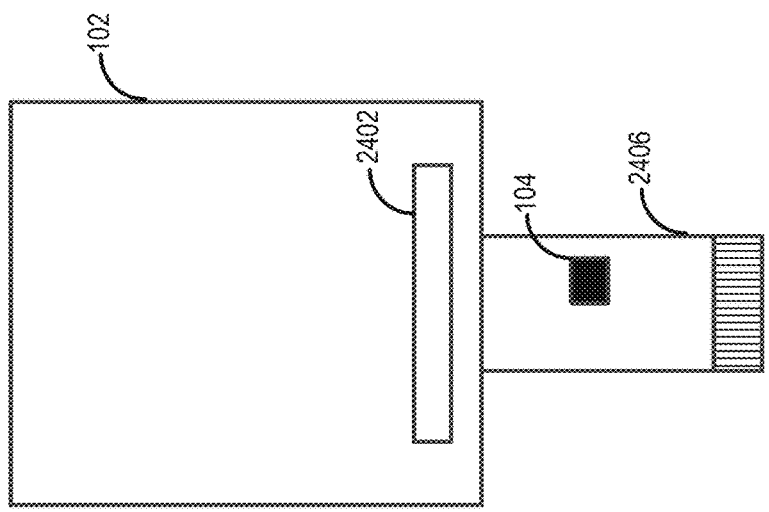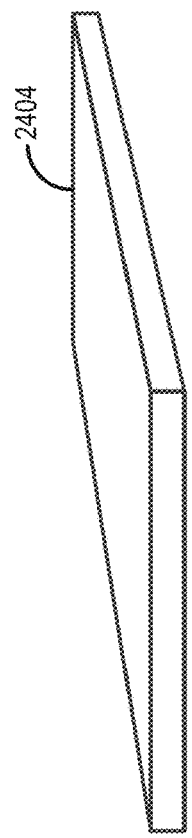
FIG. 24

US 10,840,307 B2
// 1

SUBPIXEL ARRANGEMENTS OF DISPLAYS AND METHOD FOR RENDERING THE SAME

CROSS-REFERENCE TO RELATED APPLICATIONS

This application is a continuation of U.S. patent application Ser. No. 14/380,201, filed on Aug. 21, 2014, which is a 371 of International application No. PCT/CN2013/086513, filed on Nov. 4, 2013, both of which are hereby incorporated by reference in their entireties.

BACKGROUND

The disclosure relates generally to displays, and more particularly, to subpixel arrangements of displays and a method for rendering the same.

Displays are commonly characterized by display resolution, which is the absolute number of distinct pixels in each dimension that can be displayed (e.g., 1920×1080) or by display density (a.k.a. pixels per inch—PPI) concerning the relative numbers of pixels per inch. Many displays are, for various reasons, not capable of displaying different color channels at the same site. Therefore, the pixel grid is divided into single-color parts that contribute to the displayed color when viewed from a distance. In some displays, such as liquid crystal display (LCD), organic light-emitting diode (OLED) display, electrophoretic ink (E-ink) display, electroluminescent display (ELD) or light-emitting diode (LED) lamp display, these single-color parts are separately addressable elements, which are known as subpixels.

Various subpixel arrangements (layouts, schemes) have been proposed to operate with a proprietary set of subpixel rendering algorithms in order to improve the display quality by increasing the display density of a display and by anti-aliasing text with greater details. For example, LCDs typically divide each pixel into three strip subpixels (e.g., red, green, and blue subpixels) or four quadrate subpixels (e.g., red, green, blue, and white subpixels) so that each pixel can present brightness and a full color. Compared with LCDs, it is even more difficult to increase the display density of OLED displays by reducing the size of individual subpixel because the organic light-emitting layers of OLEDs are fabricated by evaporation techniques using fine metal masks (FMMs). Due to the process accuracy for patterning organic materials using FMMs, the minimum size of each organic light-emitting layer is limited. To overcome such limitation, various subpixel arrangements with subpixel rendering algorithms have been applied to increase the display density of OLED displays.

In an OLED display having a "diamond" pixel array 2600 shown in FIG. 26, the green subpixels G are repeated in a single line, while red subpixels R and blue subpixels B are larger and alternate between the lines of green subpixels. The subpixel array 2600 is divided into various pixels, each of which consists of one red subpixel and two half-green subpixels (pixel 2602) or consists of one blue subpixel and two half-green subpixels (pixel 2604). Apparently, in this example, only the number of green subpixels is the same as the number of pixels on the display, while the number of either the red or blue subpixels is only half of the number of pixels in display. That is, the actual color resolution of red or blue subpixels is only half of the display resolution.

Accordingly, there exists a need for improved subpixel arrangements of displays and a method for rendering the same to overcome the above-mentioned problems.

SUMMARY

The present disclosure relates generally to displays, and more particularly, to subpixel arrangements of displays and a method for rendering the same.

In one example, an apparatus including a display and control logic is provided. The display includes an array of subpixel groups. Each of the subpixel groups includes one subpixel in a first color, two subpixels in a second color, and two subpixels in a third color. Subpixel groups in each row of the array are repeated. Subpixel groups in each row of the array are staggered relative to subpixels groups in an adjacent row of the array. The control logic is operatively coupled to the display and configured to receive display data and convert the display data into control signals for driving the array of subpixel groups.

In another example, an apparatus including a display and control logic is provided. The display includes a display panel having a light-emitting substrate and a driving substrate. The light-emitting substrate includes an array of subpixel groups. A subpixel of each of the subpixel groups corresponds to an OLED. The driving substrate includes an array of driving elements, each driving element configured to drive a respective OLED. Each of the subpixel groups includes one OLED in a first color, two OLEDs in a second color, and two OLEDs in a third color. Subpixel groups in each row of the array are repeated. Subpixel groups in each row of the array are staggered relative to subpixels groups in an adjacent row of the array. The control logic is operatively coupled to the display and configured to receive display data and convert the display data into control signals for driving the array of subpixel groups.

In still another example, an apparatus including a display and control logic is provided. The display includes an array of LED lamps. Each of the LED lamps includes one LED in a first color, two LED in a second color, and two LEDs in a third color. LED lamps in each row of the array are repeated. LED lamps in each row of the array are staggered relative to LED lamps in an adjacent row of the array. The control logic is operatively coupled to the display and configured to receive display data and convert the display data into control signals for driving the array of LED lamps.

In yet another example, an apparatus including a display and control logic is provided. The display includes an array of subpixel groups. Each of the subpixel groups includes two subpixels in a first color, two subpixels in a second color, and two subpixels in a third color. Subpixel groups in each row of the array are repeated. Subpixel groups in each row of the array are staggered relative to subpixels groups in an adjacent row of the array. The control logic is operatively coupled to the display and configured to receive display data and convert the display data into control signals for driving the array of subpixel groups.

In a different example, a method for subpixel rendering on a display is provided. The display includes an array of subpixel groups. Each of the subpixel groups includes one subpixel in a first color, two subpixels in a second color, and two subpixels in a third color. Subpixel groups in each row of the array are repeated. Subpixel groups in each row of the array are staggered relative to subpixels groups in an adjacent row of the array. Each of the subpixel groups is divided into two pixels such that each of the two pixels includes one of the two subpixels in the second color and one of the two subpixels in the third color, and that the subpixel in the first color is shared by the two pixels. A plurality pieces of display data for displaying a plurality of pixels are first received. Each piece of display data includes a first, a second, and a third components representing the first, second, and third colors, respectively. Control signals for rendering the array of subpixel groups on the display are then provided based on the plurality pieces of display data.

Other concepts relate to software for implementing the method for subpixel rendering on a display. A software product, in accord with this concept, includes at least one machine-readable non-transitory medium and information carried by the medium. The information carried by the medium may be executable program code data regarding parameters in association with a request or operational parameters, such as information related to a user, a request, or a social group, etc.

In one example, a non-transitory machine-readable medium having information recorded thereon for subpixel rendering on a display, where when the information is read by the machine, causes the machine to perform a series of steps. The display includes an array of subpixel groups. Each of the subpixel groups includes one subpixel in a first color, two subpixels in a second color, and two subpixels in a third color. Subpixel groups in each row of the array are repeated. Subpixel groups in each row of the array are staggered relative to subpixels groups in an adjacent row of the array. Each of the subpixel groups is divided into two pixels such that each of the two pixels includes one of the two subpixels in the second color and one of the two subpixels in the third color, and that the subpixel in the first color is shared by the two pixels. A plurality pieces of display data for displaying a plurality of pixels are first received. Each piece of display data includes a first, a second, and a third components representing the first, second, and third colors, respectively. Control signals for rendering the array of subpixel groups on the display are then provided based on the plurality pieces of display data.

BRIEF DESCRIPTION OF THE DRAWINGS

The embodiments will be more readily understood in view of the following description when accompanied by the below figures and wherein like reference numerals represent like elements, wherein:

FIG. 24 is a diagram illustrating one example of implementing the control logic shown in FIG. 1 as an integrated circuit (IC) chip in accordance with one embodiment set forth in the disclosure;

FIG. 25 is a diagram illustrating another example of implementing the control logic shown in FIG. 1 as an IC chip in accordance with one embodiment set forth in the disclosure.

DETAILED DESCRIPTION

In the following detailed description, numerous specific details are set forth by way of examples in order to provide a thorough understanding of the relevant disclosures. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure.

Among other novel features, the present disclosure provides the ability to further increase the actual color resolution by overcoming the limitations of mask-based organic materials evaporation techniques. The novel subpixel arrangements of the present disclosure are fully compatible with existing fabrication techniques and thus, ensure the relative high yield and low production cost. The novel subpixel arrangements of the present disclosure also make the color distribution of the display more uniform compared with known solutions, thereby increasing the user experience. The novel subpixel arrangements of the present disclosure can be applied to various displays, such as but not limited to, top-emitting OLED displays, bottom-emitting OLED displays, or billboard displays with lamps.

Additional novel features will be set forth in part in the description which follows, and in part will become apparent to those skilled in the art upon examination of the following and the accompanying drawings or may be learned by production or operation of the examples. The novel features of the present disclosure may be realized and attained by practice or use of various aspects of the methodologies, instrumentalities, and combinations set forth in the detailed examples discussed below.

Figure 1:
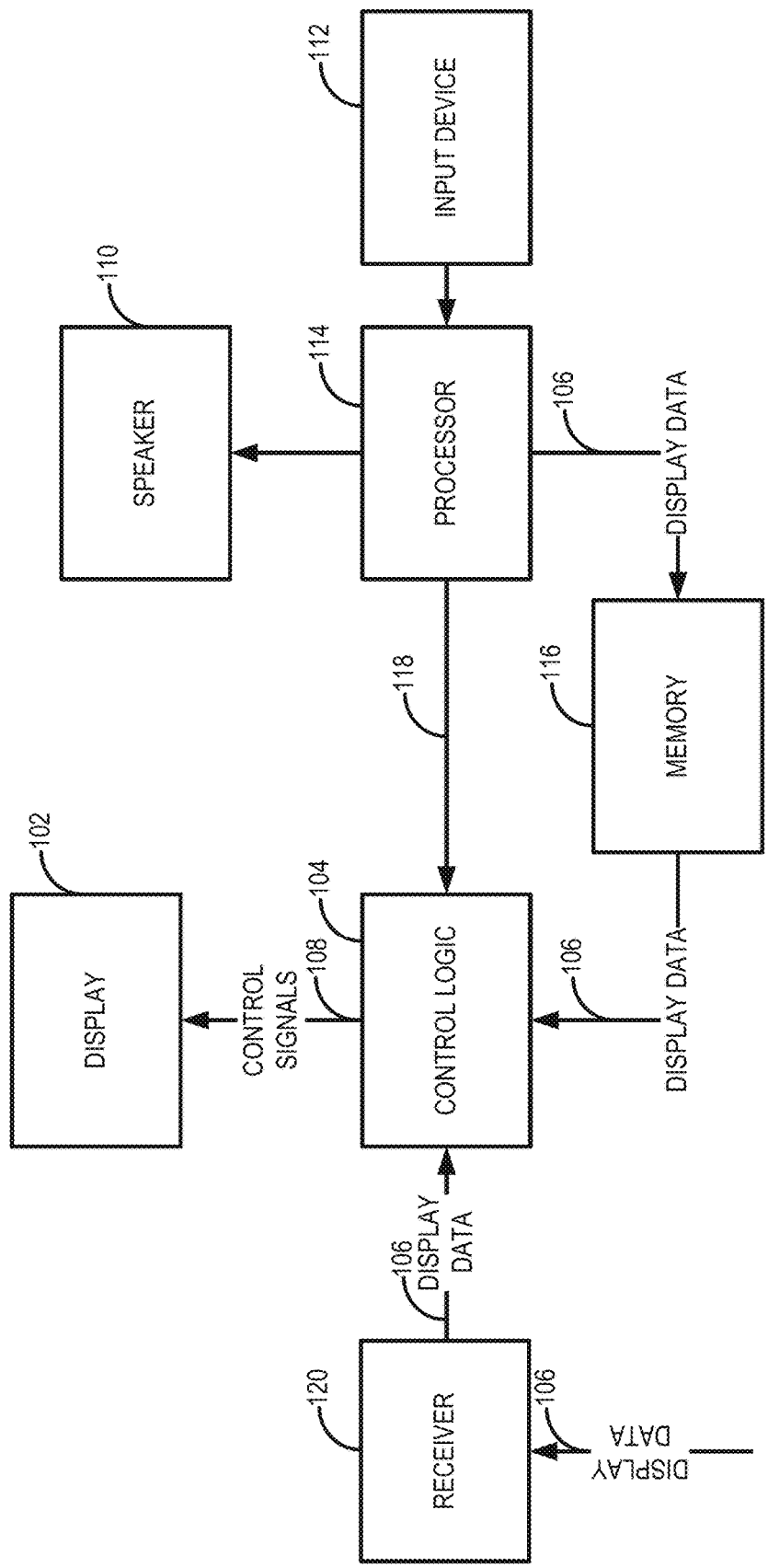
FIG. 1 is a block diagram illustrating an apparatus including a display and control logic in accordance with one embodiment set forth in the disclosure.

FIG. 1 illustrates an apparatus 100 including a display 102 and control logic 104. The apparatus 100 may be any suitable device, for example, a television set, laptop computer, desktop computer, netbook computer, media center, handheld device (e.g., dumb or smart phone, tablet, etc.), electronic billboard, electronic sign, gaming console, set-top box, printer, or any other suitable device. In this example, the display 102 is operatively coupled to the control logic 104 and is part of the apparatus 100, such as but not limited to, a television screen, computer monitor, dashboard, head-mounted display, electronic billboard, or electronic sign. The display 102 may be an LCD, OLED display, E-ink display, ELD, billboard display with LED or incandescent lamps, or any other suitable type of display. The control logic 104 may be any suitable hardware, software, firmware, or combination thereof, configured to receive display data 106 and render the received display data 106 into control signals 108 for driving the subpixels on the display 102. For example, subpixel rendering algorithms for various subpixel arrangements may be part of the control logic 104 or implemented by the control logic 104. The control logic 104 may include any other suitable components, including an encoder, a decoder, one or more processors, controllers (e.g., timing controller), and storage devices. The control logic 104 may be implemented as a standalone integrated circuit (IC) chip or part of the driving circuits of the display 102. One example of the control logic 104 and a method for rendering subpixels of the display 102 implemented by the control logic 104 are described below in detail. The apparatus 100 may also include any other suitable component such as, but not limited to, a speaker 110 and an input device 112, e.g., a mouse, keyboard, remote controller, handwriting device, camera, microphone, scanner, etc.

In one example, the apparatus 100 may be a laptop or desktop computer having a display 102. In this example, the apparatus 100 also includes a processor 114 and memory 116. The processor 114 may be, for example, a graphic processor (e.g., GPU), a general processor (e.g., APU, accelerated processing unit; GPGPU, general-purpose computing on GPU), or any other suitable processor. The memory 116 may be, for example, a discrete frame buffer or a unified memory. The processor 114 is configured to generate display data 106 in display frames and temporally store the display data 106 in the memory 116 before sending it to the control logic 104. The processor 114 may also generate other data, such as but not limited to, control instructions 118 or test signals, and provide them to the control logic 104 directly or through the memory 116. The control logic 104 then receives the display data 106 from the memory 116 or from the processor 114 directly.

In another example, the apparatus 100 may be a television set having a display 102. In this example, the apparatus 100 also includes a receiver 120, such as but not limited to, an antenna, radio frequency receiver, digital signal tuner, digital display connectors, e.g., HDMI, DVI, DisplayPort, USB, Bluetooth, WiFi receiver, or Ethernet port. The receiver 120 is configured to receive the display data 106 as an input of the apparatus 100 and provide the native or modulated display data 106 to the control logic 104.

In still another example, the apparatus 100 may be a handheld device, such as a smart phone or a tablet. In this example, the apparatus 100 includes the processor 114, memory 116, and the receiver 120. The apparatus 100 may both generate display data 106 by its processor 114 and receive display data 106 through its receiver 120. For example, the apparatus 100 may be a handheld device that works as both a mobile television and a mobile computing device. In any event, the apparatus 100 at least includes the display 102 with specifically designed subpixel arrangements as described below in detail and the control logic 104 for the specifically designed subpixel arrangements of the display 102.

Referring now to FIGS. 24 and 25, the control logic 104 is implemented as a standalone IC chip in these examples, such as a field-programmable gate array (FPGA) or an application-specific integrated circuit (ASIC). In one example illustrated in FIG. 24, the apparatus 100 is a handheld device such as a smartphone or a tablet, which includes the display 102 with driving circuits 2402 and a motherboard 2404. The display 102 is connected to the motherboard 2404 through a flexible printed circuit (FPC) 2406. The IC chip implementing the control logic 104 is arranged on the FPC 2406 such that the handheld device can be easily integrated with the control logic 104 without changing the motherboard 2404. In another example illustrated in FIG. 25, the IC chip implementing the control logic 104 is arranged on the motherboard 2404 to reduce the cost of the handheld device.

Figure 2:
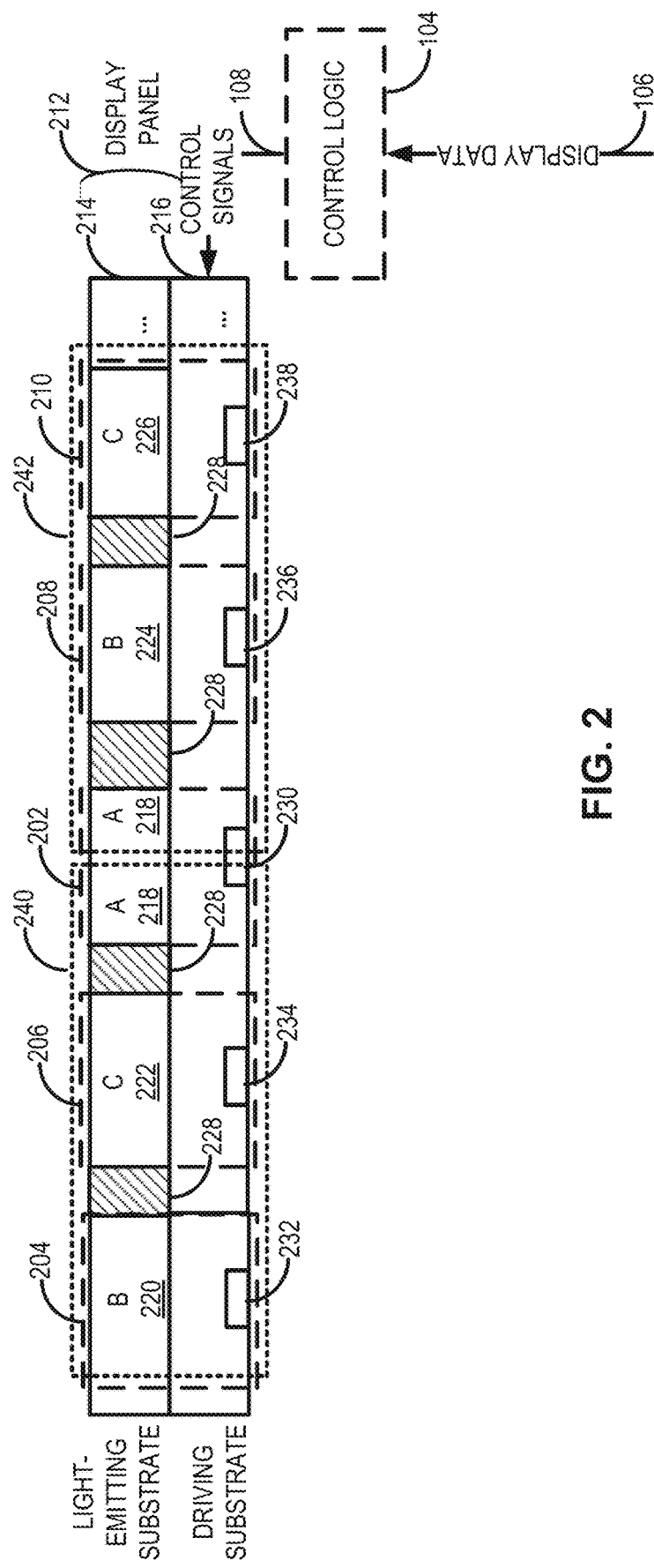
FIG. 2 is a side-view diagram illustrating one example of the display shown in FIG. 1 in accordance with one embodiment set forth in the disclosure.

FIG. 2 illustrates one example of a display 102 including a group of subpixels 202, 204, 206, 208, 210. The display 102 may be any suitable type of display, for example, OLED displays, such as an active-matrix (AM) OLED display, passive-matrix (PM) OLED display, or any other suitable display. The display 102 may include a display panel 212 operatively coupled to the control logic 104.

In this example, the display panel 212 includes a light-emitting substrate 214 and a driving substrate 216. As shown in FIG. 2, the light-emitting substrate 214 includes a plurality of OLEDs 218, 220, 222, 224, 226 corresponding to the plurality of subpixels 202, 204, 206, 208, 210, respectively. A, B, and C in FIG. 2 denote OLEDs in three different colors, such as but not limited to, red, green, blue, yellow, cyan, magenta, or white. The light-emitting substrate 214 also includes a black matrix 228 disposed between the OLEDs 218, 220, 222, 224, 226, as shown in FIG. 2. The black matrix 228, as the borders of the subpixels 202, 204, 206, 208, 210, is used for blocking lights coming out from the parts outside the OLEDs 218, 220, 222, 224, 226. Each OLED 218, 220, 222, 224, 226 in the light-emitting substrate 214 can emit light in a predetermined color and brightness. In this example, the driving substrate 216 includes a plurality of driving elements 230, 232, 234, 236, 238, such as thin film transistors (TFTs), corresponding to the plurality of OLEDs 218, 220, 222, 224, 226 of the plurality of subpixels 202, 204, 206, 208, 210, respectively. The driving elements 230, 232, 234, 236, 238 may be individually addressed by the control signals 108 from the control logic 104 and are configured to drive the corresponding subpixels 202, 204, 206, 208, 210, by controlling the light emitting from the respective OLEDs 218, 220, 222, 224, 226 according to the control signals 108. The display panel 212 may include any other suitable component, such as one or more glass substrates, polarization layers, or a touch panel, as known in the art.

As shown in FIG. 2, each of the plurality of subpixels 202, 204, 206, 208, 210 is constituted by at least an OLED and a corresponding driving element. Each OLED may be formed by a sandwich structure of an anode, an organic light-emitting layer, and a cathode, as known in the art. Depending on the characteristics (e.g., material, structure, etc.) of the organic light-emitting layer of the respective OLED, a subpixel may present a distinct color and brightness. In this example, subpixels 202, 204, 206, 208, 210, as a subpixel group, are divided into two pixels. The first pixel 240 includes subpixel B 204 and subpixel C 206, the second pixel 242 includes subpixel B 208 and subpixel C 210, and subpixel A 202 is shared by both the first and second pixels 240, 242. Here, since the display data 106 is usually programmed at the pixel level, the subpixels of each pixel or the multiple subpixels of adjacent pixels may be addressed collectively by subpixel rendering to present the appropriate brightness and color of each pixel, as designated in the display data 106, with the help of subpixel rendering algorithms. However, it is understood that, in other examples, the display data 106 may be programmed at the subpixel level such that the display data 106 can directly address individual subpixel without the need of subpixel rendering. Because it usually requires three primary colors—RGB to present a full color, specifically designed subpixel arrangements are provided below in detail for the display 102 to achieve an appropriate actual color resolution.

Although FIG. 2 is illustrated as an OLED display, it is understood that it is provided for an exemplary purpose only and without limitations. As noted above, in addition to an OLED display, the display 102 may be an LCD, E-ink display, ELD, billboard display with LED or incandescent lamps, or any other suitable type of display.

Figure 3:
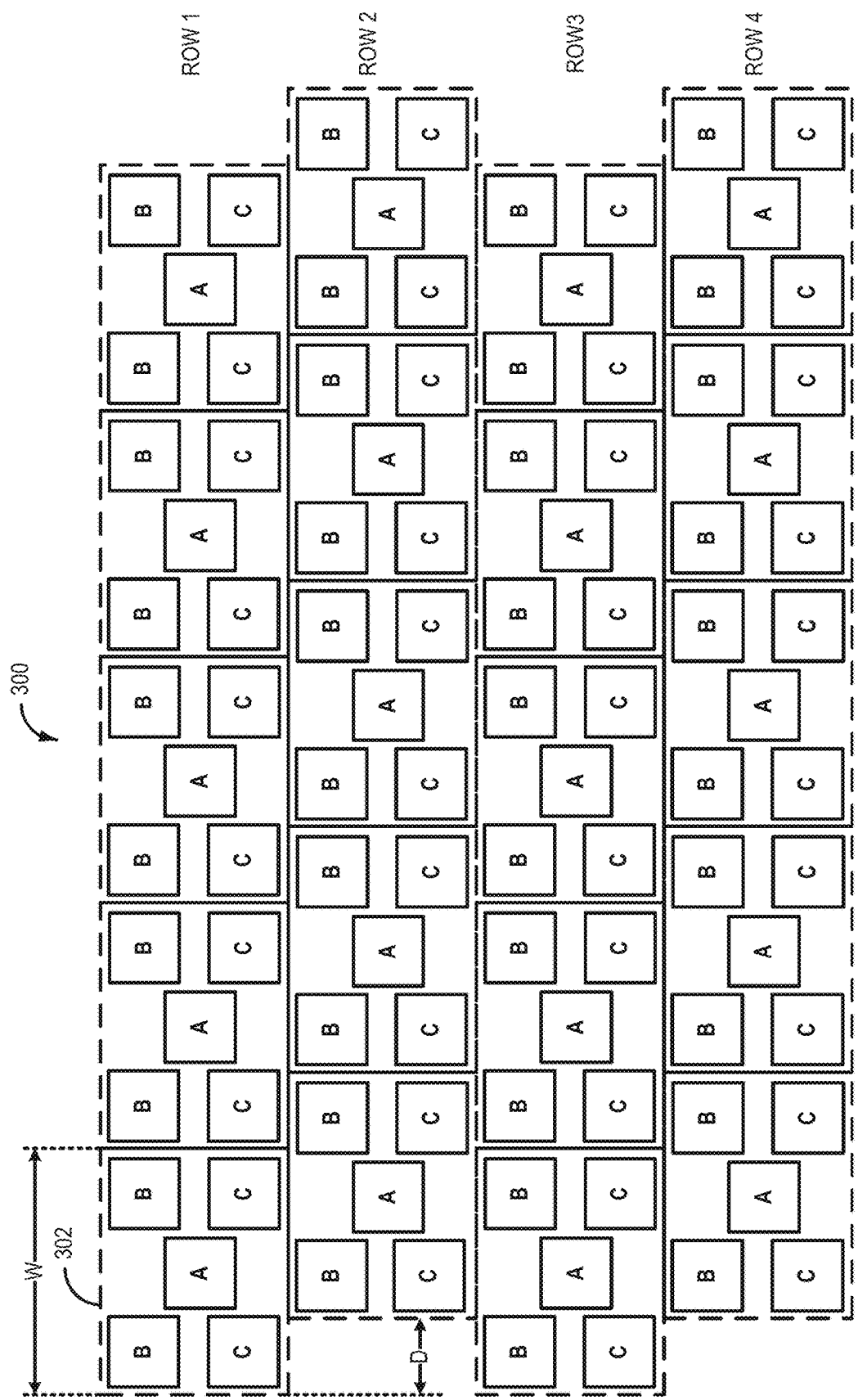
FIG. 3 is a depiction of a subpixel arrangement of a display in accordance with one embodiment set forth in the disclosure.

FIG. 3 depicts a subpixel arrangement of a display in accordance with one embodiment set forth in the disclosure. FIG. 3 may be, for example, a plan view of the display 102 and depicts one example of subpixel arrangements of the display 102. The display 102 includes an array 300 of subpixel groups 302. Each subpixel group 302 in this embodiment includes five subpixels: one subpixel in a first color A, two subpixels in a second color B, and two subpixels in a third color C. A, B, and C in FIG. 3 denote three different colors, such as but not limited to, red, green, blue, yellow, cyan, magenta, or white. Subpixel groups 302 in each row (e.g., Row 1, Row 2, Row 3, Row 4, etc.) of the array 300 are repeated along the horizontal direction. Subpixel groups 302 in each row of the array 300 are staggered relative to subpixels groups 302 in an adjacent row of the array 300. In other words, subpixel groups 302 in adjacent rows are staggered along the horizontal direction. For example, as shown in FIG. 3, subpixel groups 302 in Row 1 are staggered relative to subpixel groups 302 in Row 2 by a distance of D. It is understood that the distance D is less than the width W of the subpixel group 302. In one example, the distance D equals ½ of the width W of the subpixel group 302. In this embodiment, subpixel groups 302 in interval rows are aligned along the vertical direction. That is, subpixel groups 302 in each odd row (e.g., Row 1, Row 3, etc.) are aligned along the vertical direction, and subpixel groups 302 in each even row (e.g., Row 2, Row 4, etc.) are aligned along the vertical direction. Stated in another way, subpixel groups 302 in each row are arranged repeatedly, and the subpixel groups 302 in adjacent rows are arranged shifted from each other by, for example, ½ of the repeat pitch.

In this embodiment, the five subpixels A, B, B, C, and C are arranged in the same pattern in each subpixel group 302. For each subpixel group 302, the two subpixels in the second color B are on different sides of the subpixel in the first color A along the horizontal direction, and the two subpixels in the third color C are on different sides of the subpixel in the first color A along the horizontal direction as well. That is, in the horizontal direction, subpixel A is between the two subpixels B and also between the two subpixels C. In other words, in each subpixel group 302, one subpixel B and one subpixel C are in the left part of the subpixel group 302, the other subpixel B and the other subpixel C are in the right part of the subpixel group 302, and the subpixel A is in the middle of the subpixel group 302.

In this embodiment, in each subpixel group 302, one subpixel B is aligned with one subpixel C along the vertical direction on the left side of the subpixel A, and the other subpixel B is aligned with the other subpixel C along the vertical direction on the right side of the subpixel A. The two subpixels B are aligned along the horizontal direction, and the two subpixels C are aligned along the horizontal direction as well. In other words, the two subpixels in the same colors (i.e., B and B, or C and C) are arranged flush with each other horizontally, and the two subpixels in the different colors (i.e., B and C) are arranged flush with each other vertically. It is understood that even if two subpixels have different sizes and/or shapes, they are considered as being "aligned" if the centers of the two subpixels are aligned vertically or horizontally.

Figure 4:
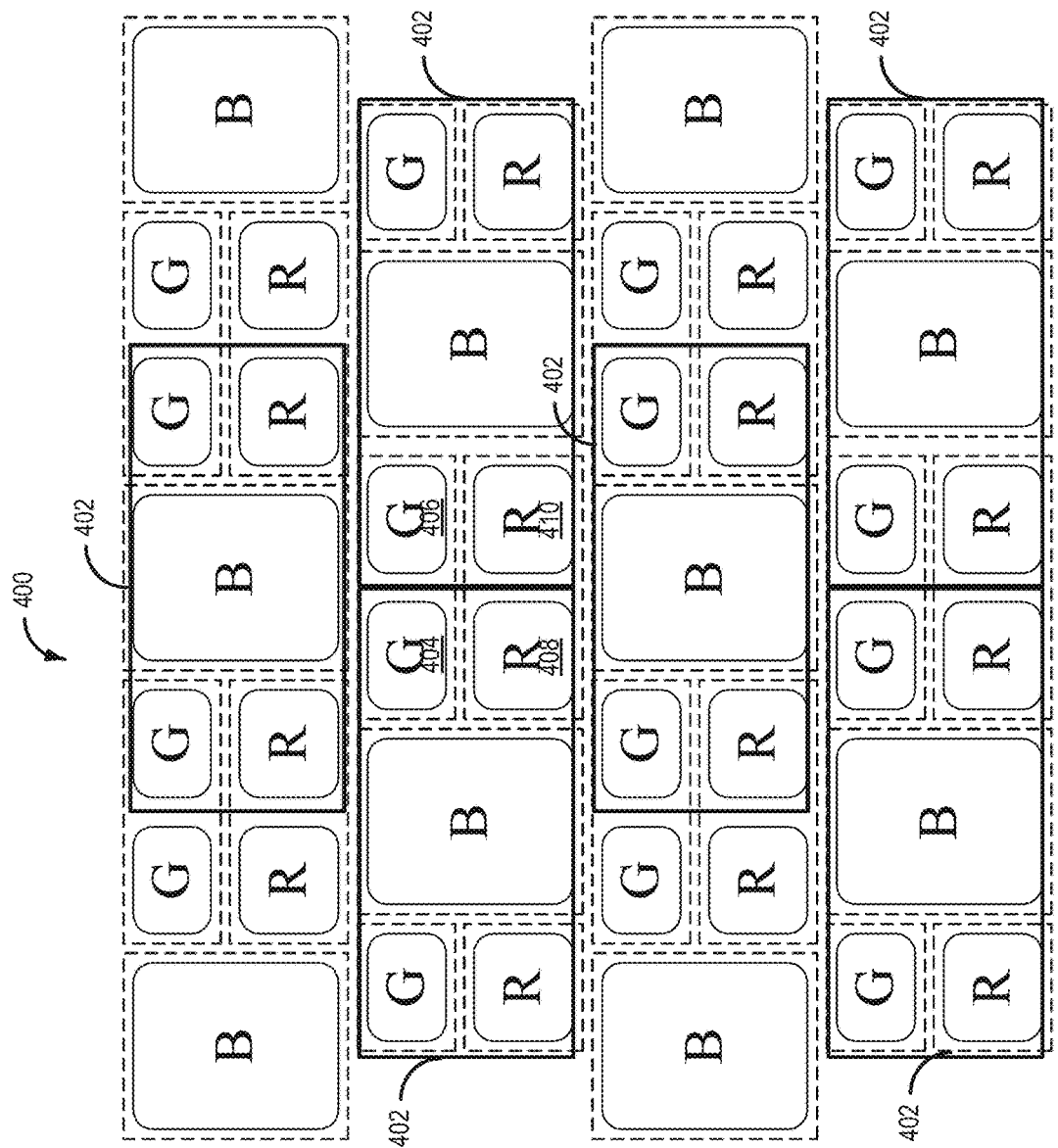
FIG. 4 is a depiction of a red, green, and blue subpixel arrangement of an OLED display in accordance with one embodiment set forth in the disclosure.

FIG. 4 depicts a red, green, and blue subpixel arrangement of an OLED display in accordance with one embodiment set forth in the disclosure. FIG. 4 may be, for example, a plan view of the display 102 and depicts one example of subpixel arrangements of the display 102. In this embodiment, each subpixel corresponds to an OLED. The same subpixel arrangement illustrated with respect to FIG. 3 is applied to the array 400 of subpixel groups 402 in this example. As shown in FIG. 4, each subpixel group 402 includes one blue OLED B, two green OLEDs G, and two red OLEDs R. In this embodiment, subpixel groups 402 are repeated horizontally in the same row and are staggered relative to subpixel groups 402 in the adjacent row by half of the width of the subpixel group 402. In each subpixel group 402, one green OLED and one red OLED are disposed on the left side of the blue OLED, and the other green OLED and the other red OLED are disposed on the right side of the blue OLED. It is understood that although FIG. 4 shows that the green OLEDs are above the red OLEDs in each subpixel group

402, their positions may be exchanged in other examples. In other words, the red OLEDs may be above the blue OLEDs in each subpixel group 402.

In this embodiment, the size of the blue OLED is larger than the size of any one of the two green OLEDs and the two red OLEDs. Stated in another way, the blue OLED is the largest subpixel among the five subpixels in each subpixel group 402. In this embodiment, each subpixel has a substantially rectangular shape with curved corners. However, it is understood that the shape of each subpixel in other examples may vary. Other shapes of the subpixels include, but are not limited to, substantially round, triangle, square, pentagon, hexagon, heptagon, octagon, or any other suitable shape. The regions between the subpixels may be filled with the black matrix as noted above. In this embodiment, the two green OLEDs in each subpixel group 402 have the same shape and size, and the two red OLEDs have the same shape and size as well. In other words, subpixels in the same color in each subpixel group 402 are geometrically identical. In one example, each of the two green OLEDs and two red OLEDs has the same shape and size. That is, except for the largest blue subpixel, each of the subpixels in the subpixel group 402 is geometrically identical in one example. It is understood that, in other examples, each subpixel group may include one red OLED, two green OLEDs, and two blue OLEDs, and the red OLED is in the middle of the subpixel group and has the largest size among the five OLEDs in the subpixel group.

Figure 5:
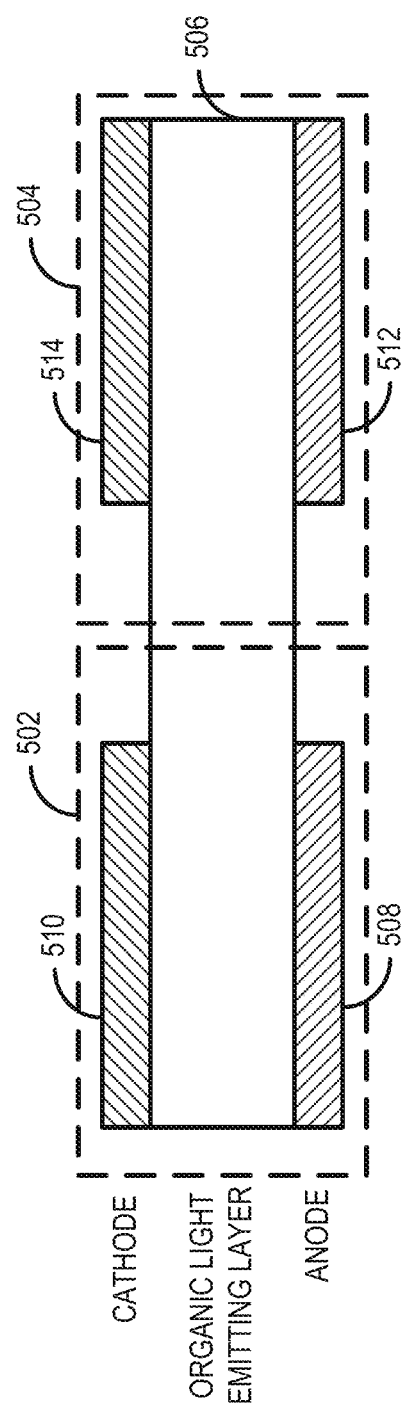
FIG. 5 is a side-view diagram illustrating an organic light-emitting layer shared by two subpixel in accordance with one embodiment set forth in the disclosure.

In this embodiment, each of the two green OLEDs in a subpixel group 402 shares the same organic light-emitting layer with a respective green OLED in the adjacent subpixel group 402 in the same row of the array 400. Similarly, each of the red OLEDs in one subpixel group 402 shares the same organic light-emitting layer with a respective red OLED in the adjacent subpixel group 402 in the same row. The dashed lines in FIG. 4 show the regions of organic light-emitting layers. For example, the green OLED 404 and the green OLED 406 in the two adjacent subpixel groups 402 share the same organic light-emitting layer, so do the red OLEDs 408, 410. That is, a common organic light-emitting layer is used by adjacent OLEDs in the same color. Referring now to FIG. 5, a first OLED 502 and a second OLED 504 in the same color are adjacent to each other and share the same organic light-emitting layer 506. Although the two adjacent OLEDs 502, 504 share the same organic light-emitting layer 506, they are distinguishable by separate anodes and/or cathodes. In this example, the first OLED 502 has its own anode 508 and cathode 510 for applying current through the organic light-emitting layer 506, and the second OLED 504 has its own anode 512 and cathode 514 as well. It is understood that in other examples, the two OLEDs 502, 504 may also share the same anode or cathode.

Figure 6:
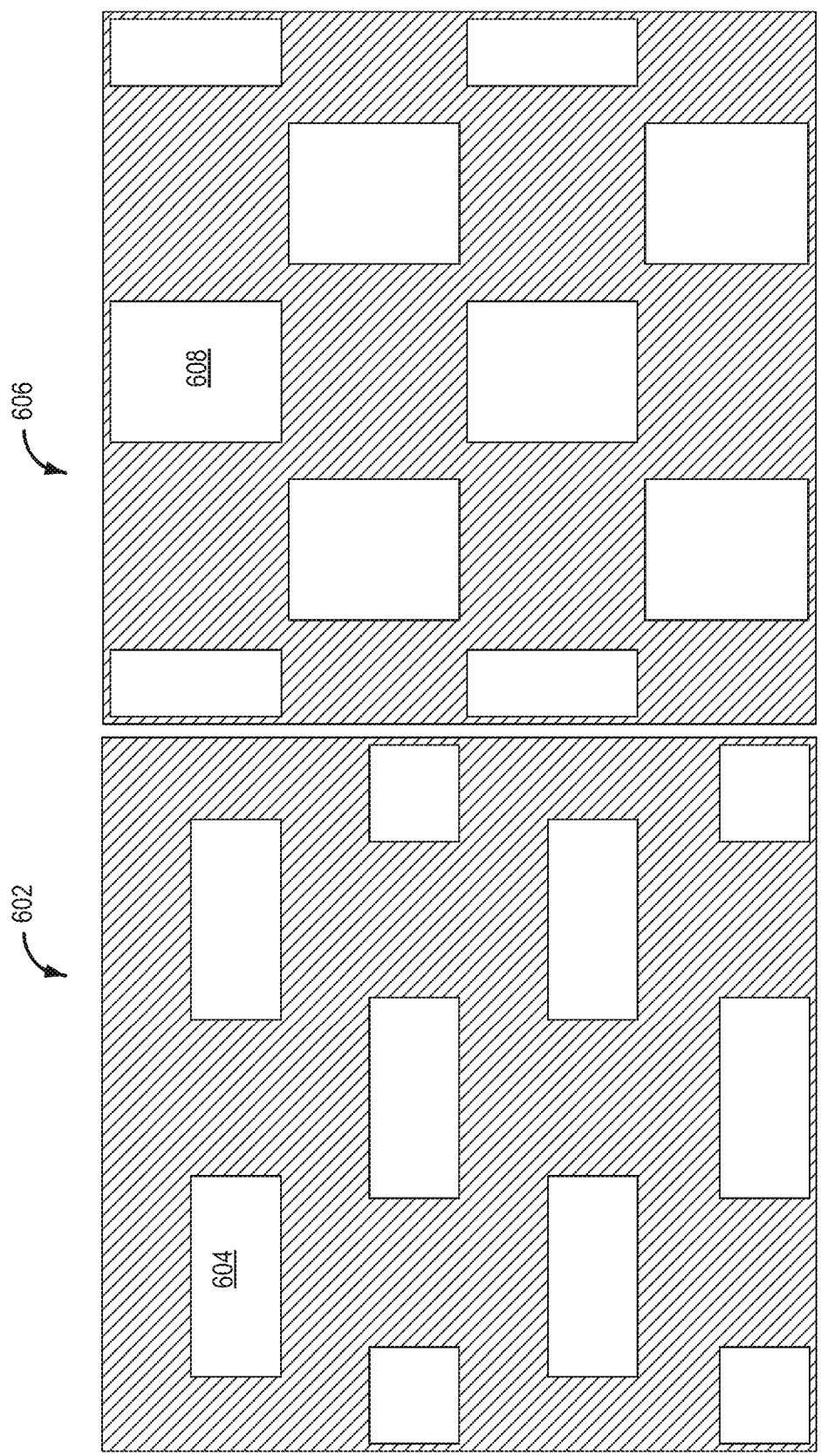
FIG. 6 is a depiction of masks used for fabricating organic light-emitting layers of the red, green, and blue OLEDs shown in FIG. 4 in accordance with one embodiment set forth in the disclosure.

As discussed above, the bottle neck of increasing the pixel density of OLED displays is the minimum size of each organic light-emitting layer limited by the pattern accuracy of masks used in organic materials evaporation. In this embodiment, this limitation is further overcome because the blue OLED has a relative large size and the adjacent green/red pixels can share a common organic light-emitting layer with a relative large size. Referring now to FIG. 6, masks (e.g., FMMs) used for fabricating organic light-emitting layers of the red, green, and blue OLEDs shown in FIG. 4 are illustrated. The first mask 602 is used for fabricating the organic light-emitting layers of the red or green OLEDs by evaporation technique. Each opening 604 on the first mask 602 corresponds to a common organic light-emitting layer shared by two adjacent red or green OLEDs. The layout of the openings 604 corresponds to the arrangement of the green or red subpixels shown in FIG. 4. The second mask 606 is used for fabricating the organic light-emitting layers of the blue OLEDs. Each opening 608 on the second mask 606 corresponds to the organic light-emitting layer of each blue OLED. The layout of the openings 608 corresponds to the arrangement of the blue subpixels shown in FIG. 4. It is understood that in other examples, the first mask 602 may be used for fabricating the organic light-emitting layers of the blue or green OLEDs, and the second mask 606 may be used for fabricating the organic light-emitting layers of the red OLEDs.

Figure 7:
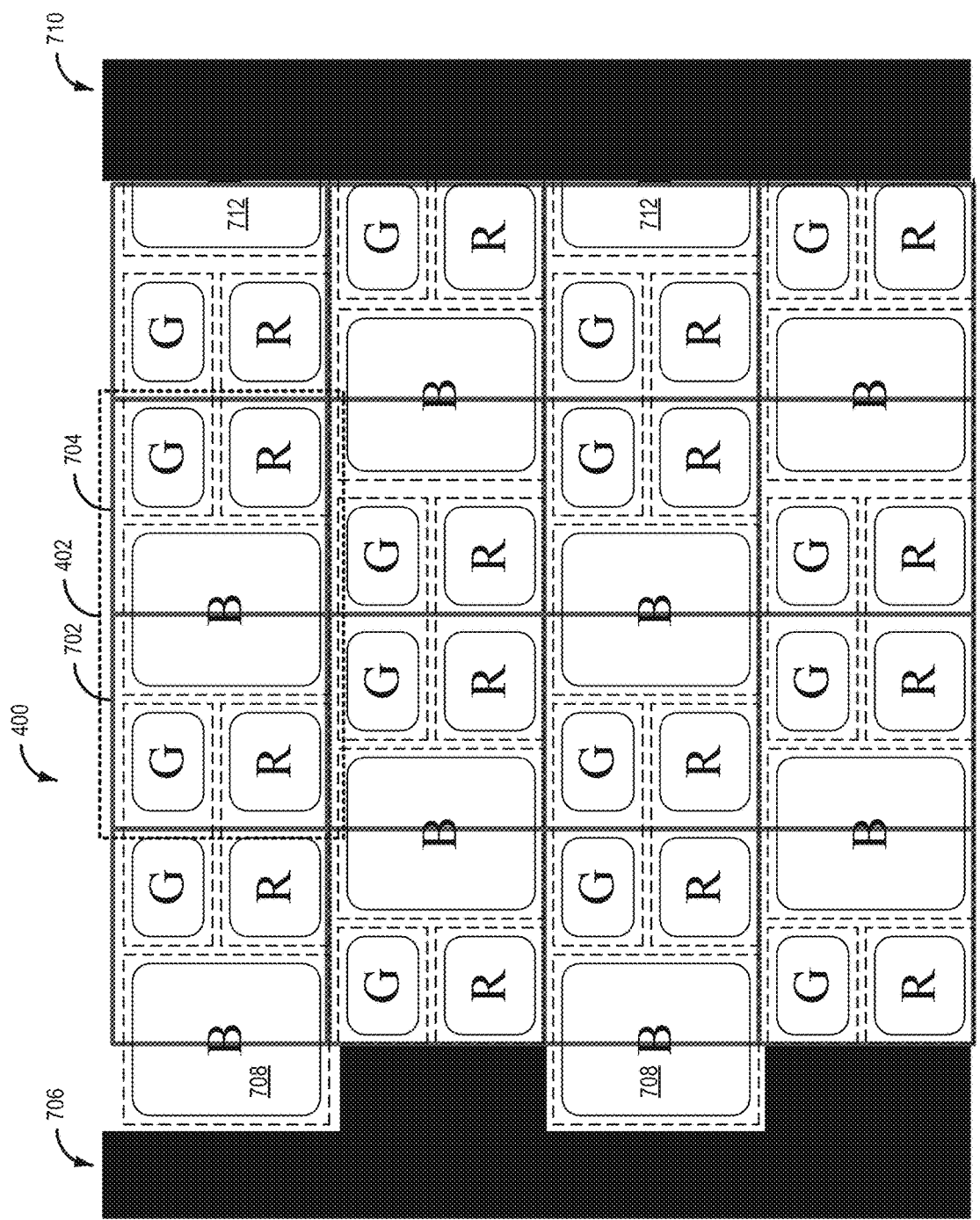
FIG. 7 is a schematic diagram of pixel division for the subpixel arrangement shown in FIG. 4 in accordance with one embodiment set forth in the disclosure.
Figure 26:
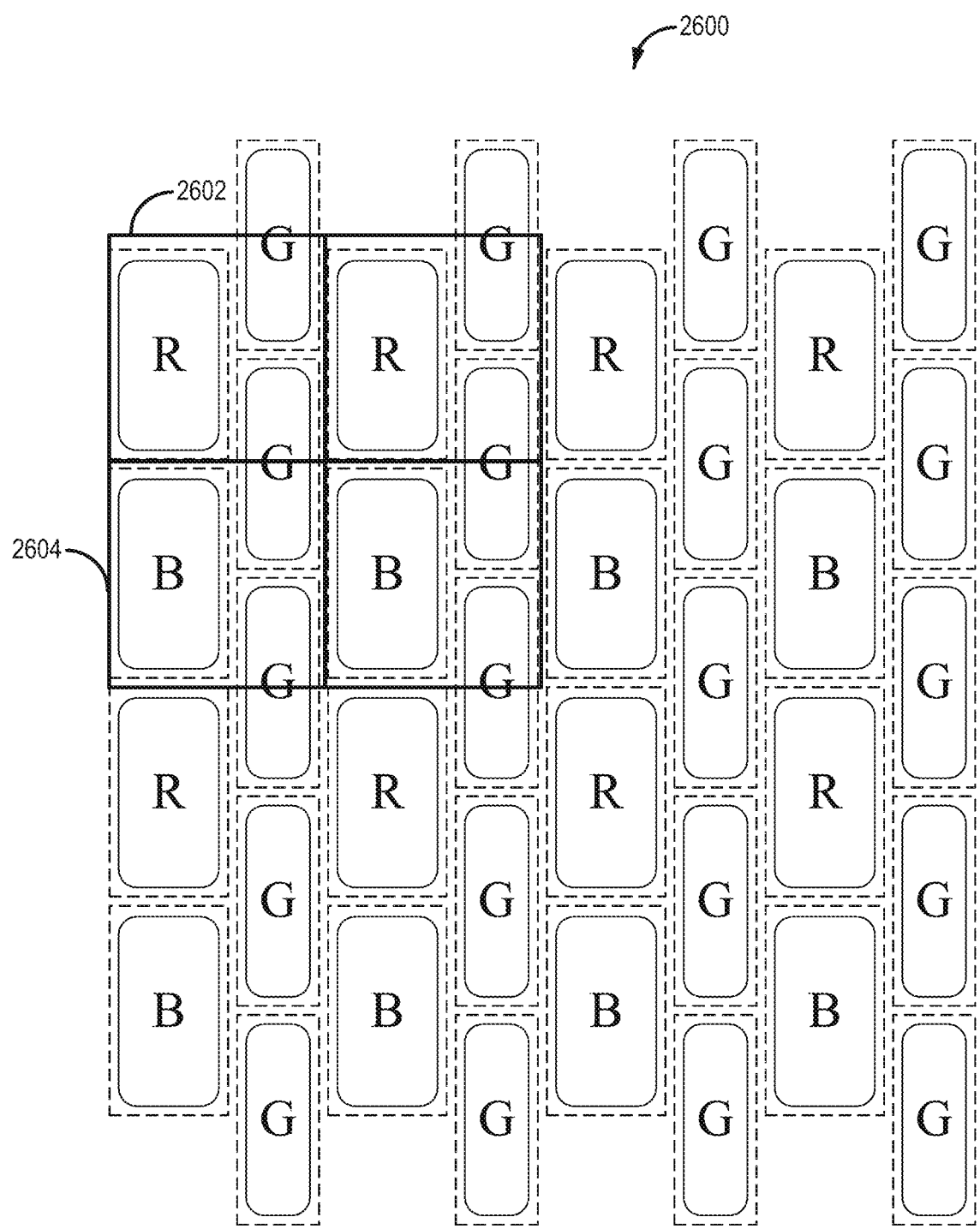
FIG. 26 is a depiction of a prior art red, green, and blue subpixel arrangement of an OLED display.

FIG. 7 illustrates one example of pixel division for the subpixel arrangement shown in FIG. 4. In this example, each subpixel group 402 is divided into two pixels 702, 704 such that, each of the two pixels 702, 704 includes one of the two subpixels in the second color (e.g., G) and one of the two subpixels in the third color (e.g., R), and that the subpixel in the first color (e.g., B) is shared by the two pixels 702, 704. As shown in FIG. 7, the subpixel group 402 is evenly divided through the middle of the blue OLED into a left part corresponding to one pixel 702, and a right part corresponding to another pixel 704. The pixel 702 includes one green OLED, one red OLED, and the left part of the blue OLED; the pixel 704 includes one green OLED, one red OLED, and the right part of the blue OLED. That is, each blue OLED on the display is shared by two adjacent pixels. As each blue OLED has only one organic light-emitting layer and one set of anode/cathode, it is necessary to implement a special subpixel rendering algorithm in the control logic 104 when the blue OLED is shared by two pixels. The details of the subpixel rendering algorithm are described below with respect to FIGS. 20-21. In this example, the numbers of green and red subpixels are the same as the number of pixels on the display, and only the number of the blue subpixels is half of the number of pixels on the display. Therefore, compared with the prior art example shown in FIG. 26, the actual color resolution in this embodiment is increased. Moreover, each pixel 702, 704 in this embodiment includes all three primary colors—RGB, which is also superior over the prior art example shown in FIG. 26.

In this embodiment, due to the staggered arrangement between adjacent rows, the left and right edges of the display become irregular. In one example, a black resin layer with a serrated edge 706 is used to cover the edges of the display such that the size and shape of the blue OLEDs 708 along the edges do not change. In this example, the same subpixel rendering algorithm can be applied to all the blue OLEDs including those 708 along the edges of the display. However, the serrated shape along the edges of the display is undesirable, in particular, when the size of each pixel is relative large. In another example, a black resin layer with a flat edge 710 is used to cover the edges of the display such that each blue OLED 712 along the edges is only half of a regular blue OLED. In this example, the subpixel rendering algorithm needs to be modified to render the blue OLEDs 712 along the edges of the display differently. For example, each blue OLED 712 along the edges is no longer shared by two pixels; rather it is included in only one pixel. Thus, the special treatment for the blue OLEDs may not be necessary for those 712 along the edges of the display. It is understood that, in other examples, the red OLED, rather than the blue OLED, may be the largest OLED and in the middle of each subpixel group, which is shared by two adjacent pixels.

Figure 8:
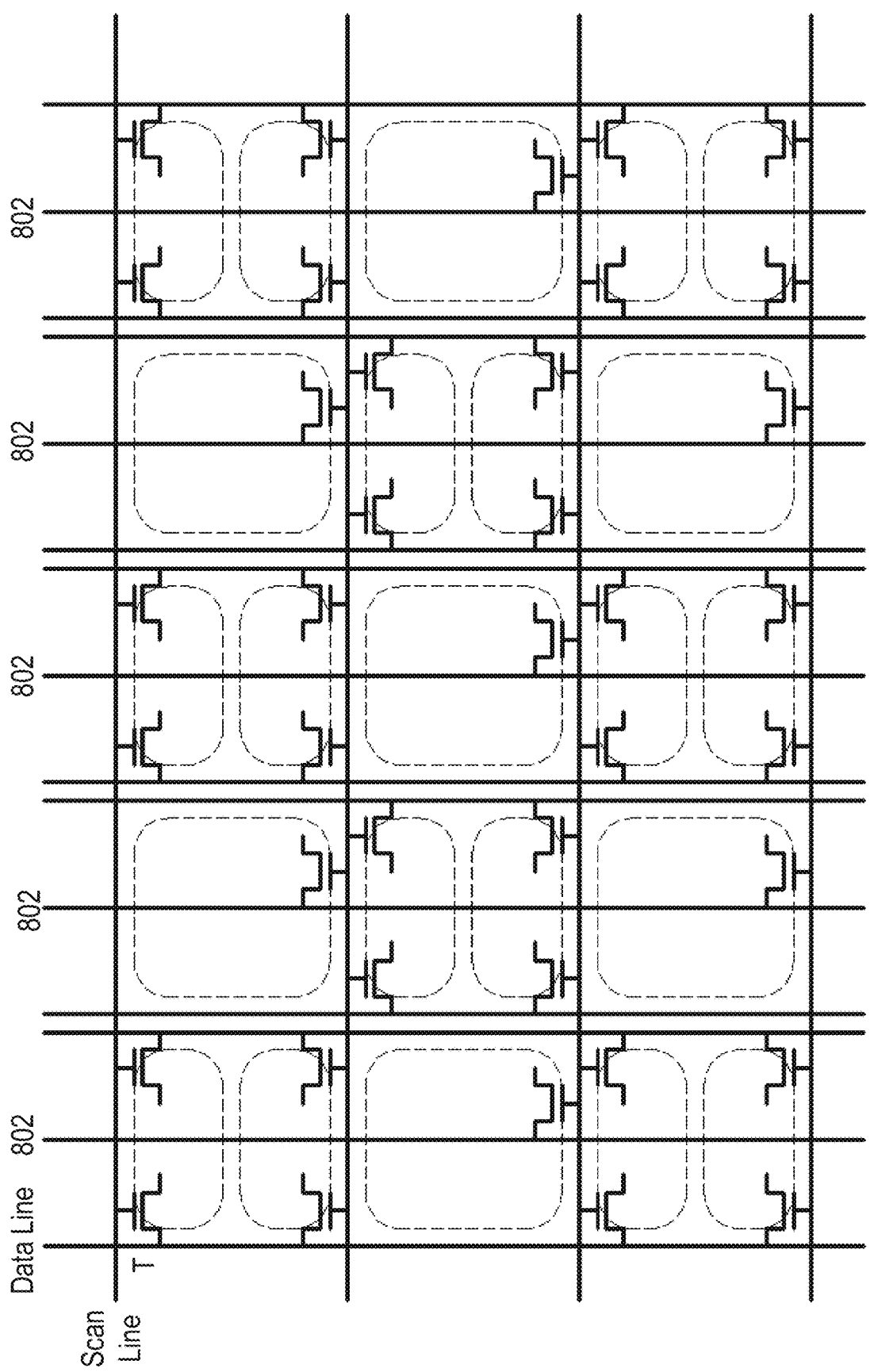
FIG. 8 is a schematic diagram of one example of wire layout for the subpixel arrangement shown in FIG. 4 in accordance with one embodiment set forth in the disclosure.

FIG. 8 depicts one example of wire layout for the subpixel arrangement shown in FIG. 4. In this example, the dashed lines illustrate the regions of organic light-emitting layers, and T is the switching transistor (e.g., a TFT) for each OLED. In this example, those data lines 802 passing through the blue or red OLEDs (the largest OLED in the middle of each subpixel group) are used only for transmitting data of blue or red subpixels. Thus, the signal duty ratio of the data lines in this example is only 50%, with half of the frames are blank. Accordingly, the bandwidth of the display data cannot be reduced in this example. However, the wire layout in this example is particular suitable for bottom-emitting OLED displays as this layout can increase the aperture ratio of bottom-emitting OLED displays.

Figure 9:
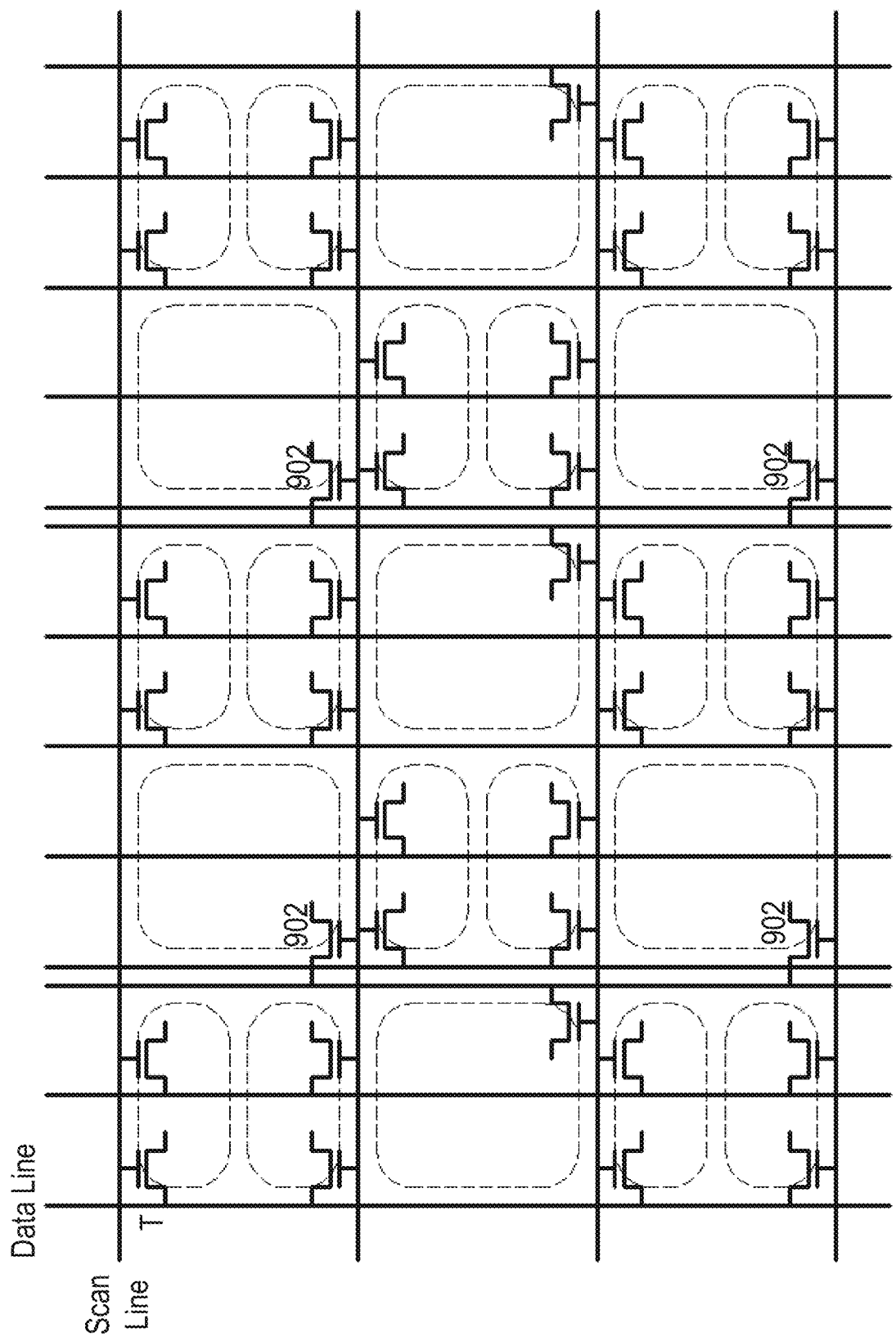
FIG. 9 is a schematic diagram of another example of wire layout for the subpixel arrangement shown in FIG. 4 in accordance with one embodiment set forth in the disclosure.

FIG. 9 depicts another example of wire layout for the subpixel arrangement shown in FIG. 4. In this example, the dashed lines illustrate the regions of organic light-emitting layers, and T is the switching transistor for each OLED. In this example, the number of data lines is reduced compared with the example in FIG. 8 such that the signal duty ratio of each data line increases to 100%, thereby reducing the bandwidth of the display data, reducing the width of IC, and reducing the number of source pins. However, as some switching transistors 902 of the blue or red OLEDs (the largest OLED in the middle of each subpixel group) cross adjacent data lines, anti-coupling issues need to addressed in layout design.

Figure 10:
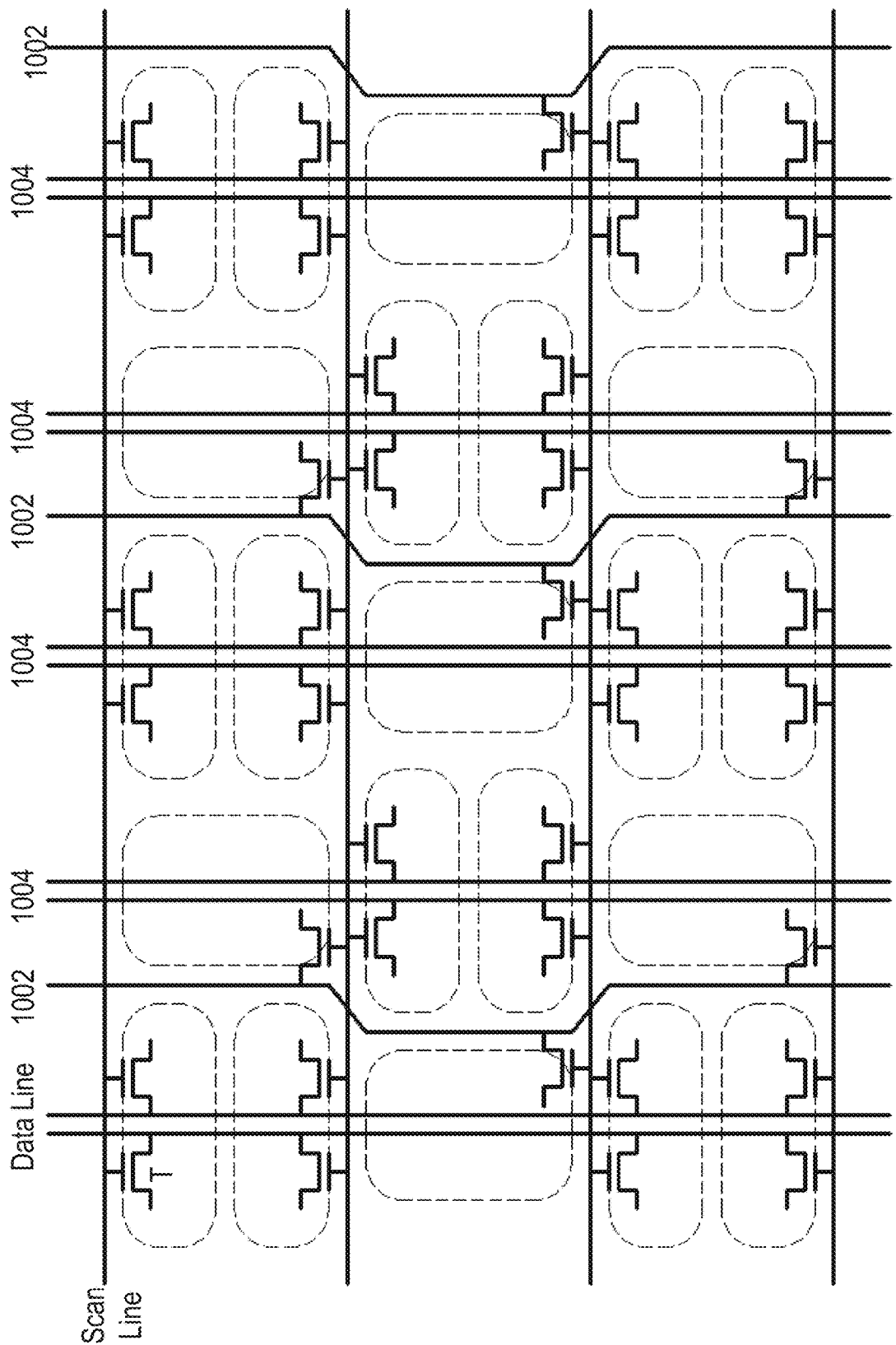
FIG. 10 is a schematic diagram of still another example of wire layout for the subpixel arrangement shown in FIG. 4 in accordance with one embodiment set forth in the disclosure.

FIG. 10 depicts still another example of wire layout for the subpixel arrangement shown in FIG. 4. In this example, the dashed lines illustrate the regions of organic light-emitting layers, and T is the switching transistor for each OLED. As the OLEDs in different colors have different sizes, the edges between organic light-emitting layers are not aligned in the vertical direction. Thus, in this example, some data lines 1002 are polygonal lines that extend along the edges of organic light-emitting layers. These polygonal data lines 1002 in this example are all single data lines. Other data lines 1004 passing through the blue or red OLEDs (the largest OLED in the middle of each subpixel group) are double straight lines as shown in FIG. 10. Similar to the example in FIG. 9, the number of data lines is reduced compared with the example in FIG. 8 such that the signal duty ratio of each data line increases to 100%, thereby reducing the bandwidth of the display data, reducing the width of IC, and reducing the number of source pins.

Figure 11:
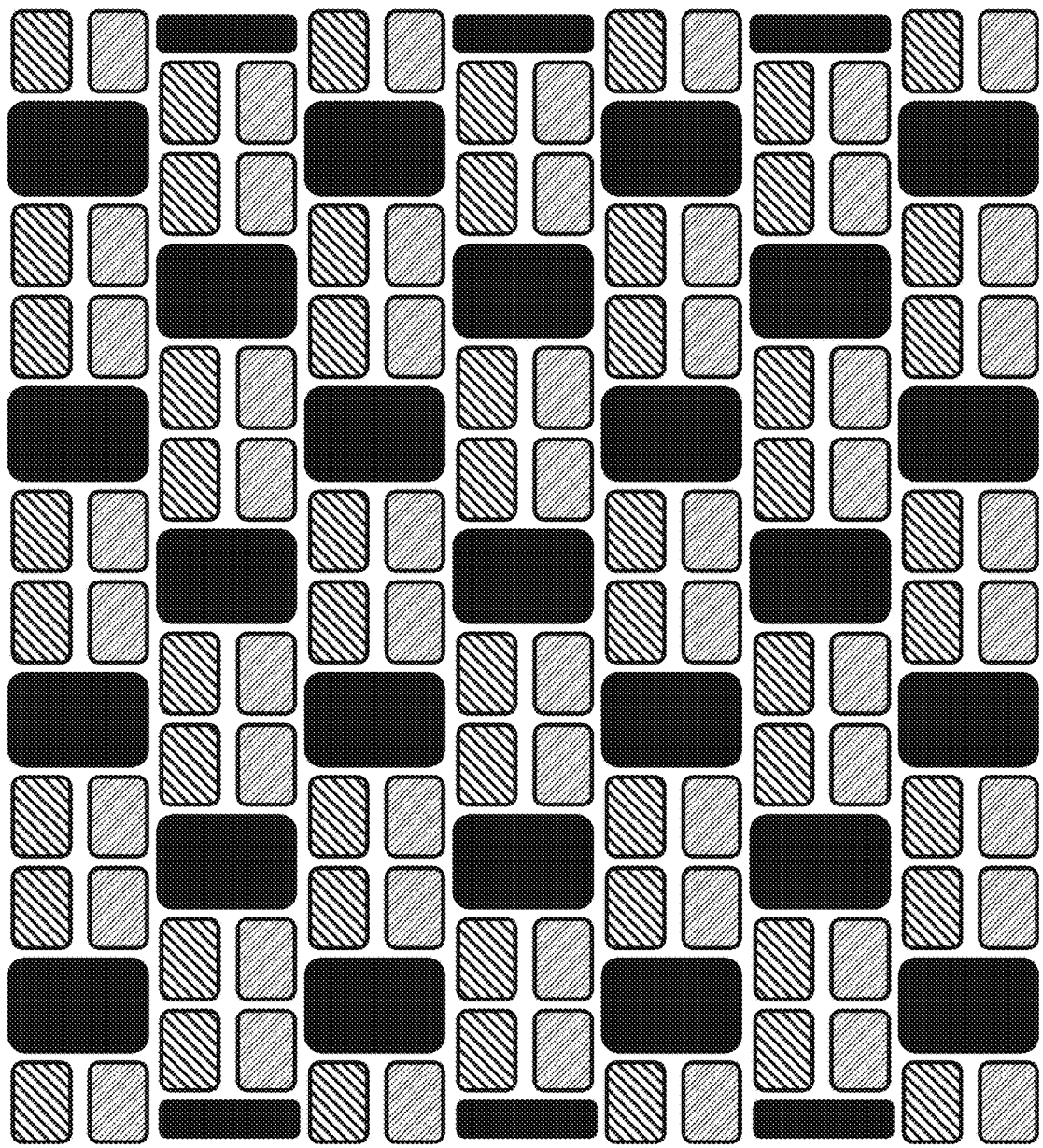
FIG. 11 is a depiction of displaying a white screen on a display using the subpixel arrangement shown in FIG. 4 in accordance with one embodiment set forth in the disclosure.
Figure 12:
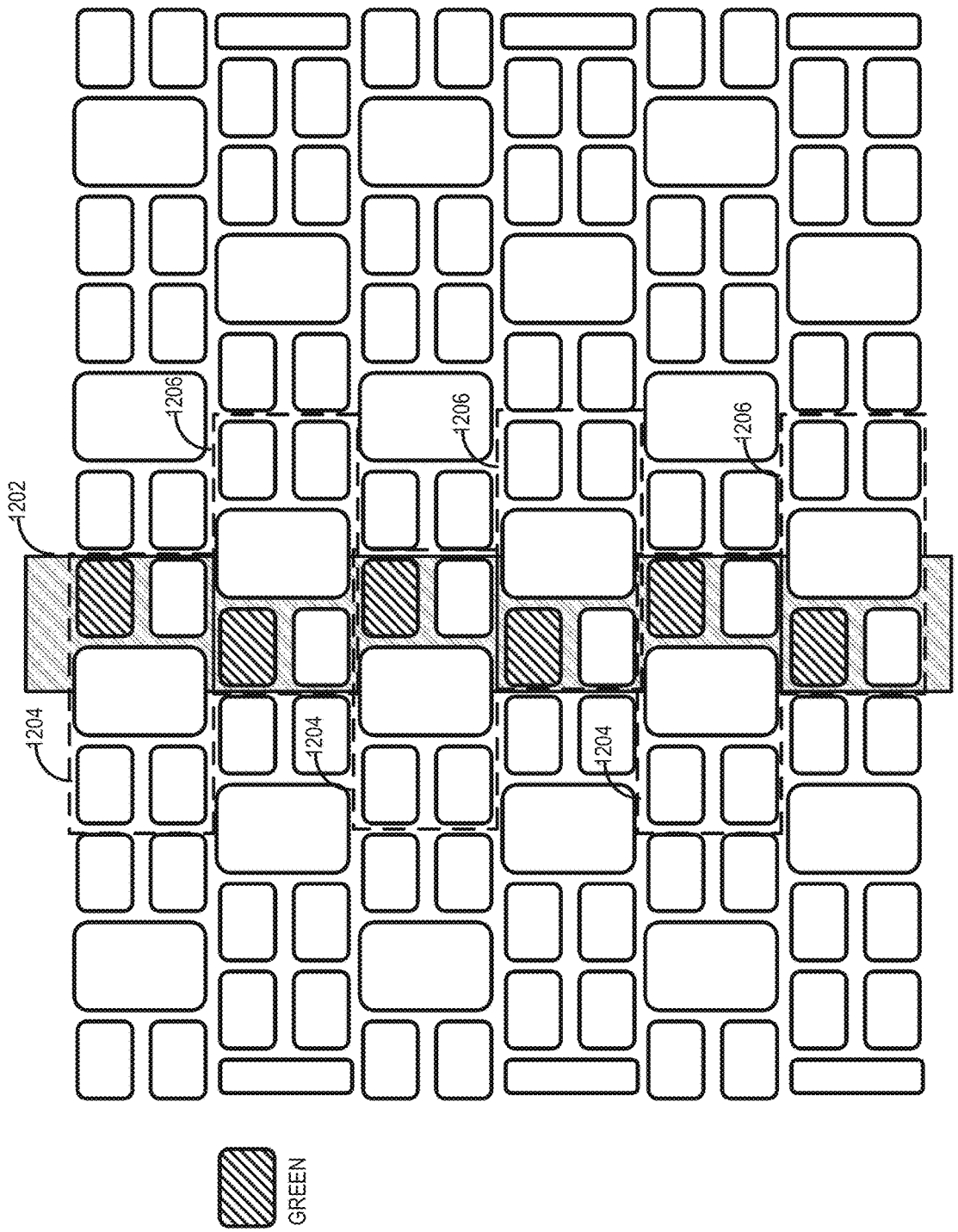
FIG. 12 is a depiction of displaying a single green vertical line on a display using the subpixel arrangement shown in FIG. 4 in accordance with one embodiment set forth in the disclosure.

FIGS. 11-17 depict various examples of displaying different patterns on a display using the subpixel arrangement shown in FIG. 4. In FIG. 11, each subpixel is fully turned on (i.e., the value of each subpixel is 255), and a white screen is displayed. In FIG. 12, a single green vertical line 1202 is displayed by fully turning on half of the green subpixels (i.e., the value of the green subpixel is 255) in the corresponding subpixel groups 1204, 1206. For example, in each odd row of subpixels, the green subpixels in the right part of the corresponding subpixel groups 1204 are turned on; in each even row of subpixels, the green subpixels in the left part of the corresponding subpixel groups 1206 are turned on. It is understood that because of the staggered arrangement between adjacent rows, the green subpixels in adjacent rows are not strictly aligned in the vertical direction and thus, the single green vertical line 1202 in this example is not a straight line. However, the human vision system would consider the single green vertical line 1202 as a straight line when viewed from a distance.

Figure 13:
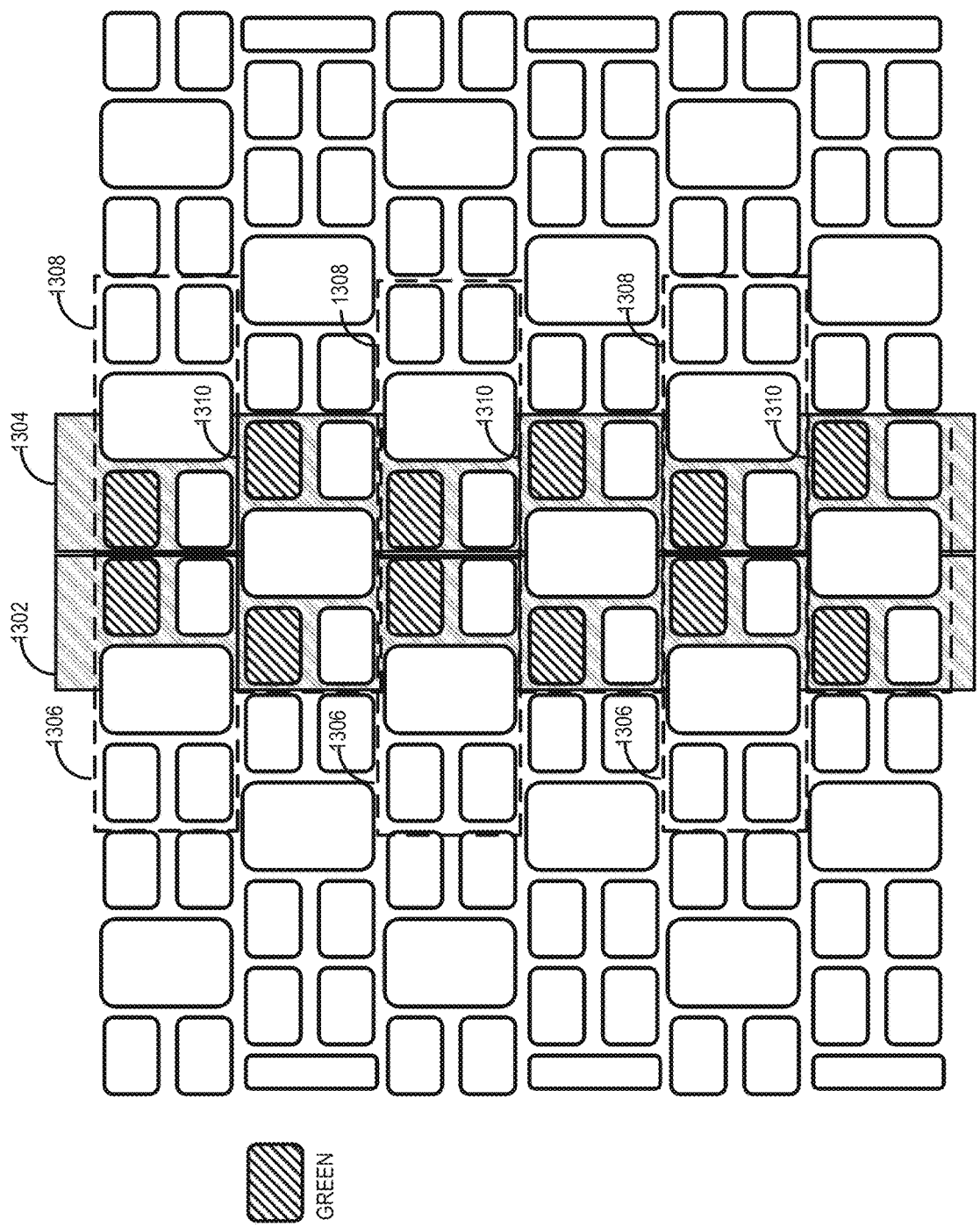
FIG. 13 is a depiction of displaying two adjacent green vertical lines on a display using the subpixel arrangement shown in FIG. 4 in accordance with one embodiment set forth in the disclosure.

In FIG. 13, two adjacent green vertical lines 1302, 1304 are displayed by fully turning on half or all of the green subpixels (i.e., the value of the green subpixel is 255) in the corresponding subpixel groups 1306, 1308, 1310. In each odd row of subpixels, half of the green subpixels in the two adjacent subpixel groups 1306, 1308 are turned on. For example, the green subpixels in the right part of the corresponding subpixel groups 1306 in each odd row are turned on, and the green subpixels in the left side of the corresponding subpixel groups 1308 in each odd row are turned on. Subpixel groups 1306 and subpixel groups 1308 are adjacent to each other in each odd row. In each even row, all the green subpixels in the corresponding subpixel groups 1310 are turned on. Similarly, the human vision system would consider the two adjacent green vertical lines 1302, 1304 as two straight lines when viewed from a distance.

Figure 14:
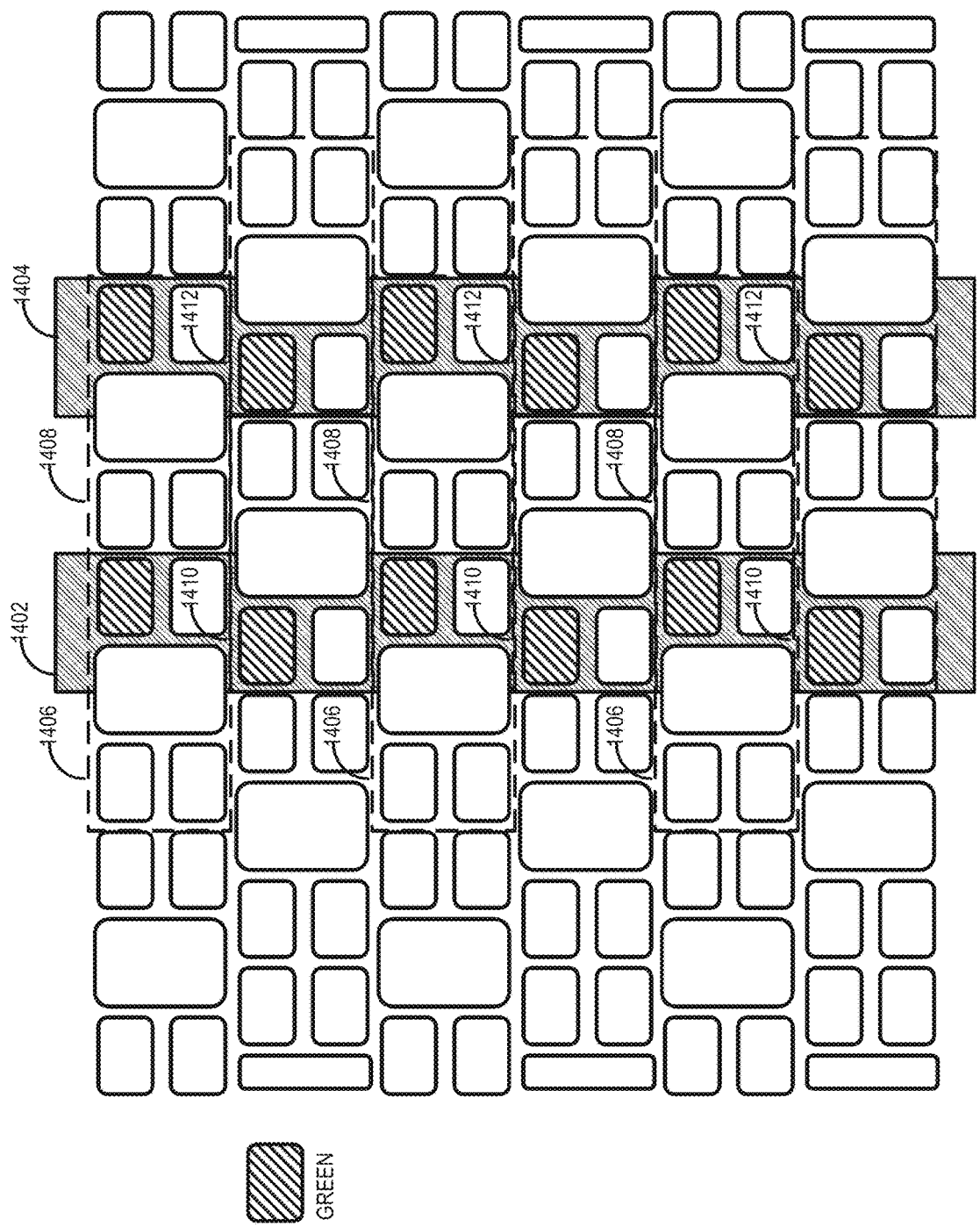
FIG. 14 is a depiction of displaying two separate green vertical lines on a display using the subpixel arrangement shown in FIG. 4 in accordance with one embodiment set forth in the disclosure.

In FIG. 14, two separate green vertical lines 1402, 1404 are displayed by fully turning on half of the green subpixels (i.e., the value of the green subpixel is 255) in the corresponding subpixel groups 1406, 1408, 1410, 1412. In each odd row of subpixels, half of the green subpixels in the two adjacent subpixel groups 1406, 1408 are turned on; in each even row of subpixels, half of the green subpixels in the two adjacent subpixel groups 1410, 1412 are turned on. For example, the green subpixels in the right part of the corresponding subpixel groups 1406, 1408 in each odd row are turned on, and the green subpixels in the left part of the corresponding subpixel groups 1410, 1412 in each even row are turned on. Subpixel groups 1406 and subpixel groups 1408 are adjacent to each other in each odd row, and subpixel groups 1410 and subpixel groups 1412 are adjacent to each other in each even row. Similarly, the human vision system would consider the two separate green vertical lines 1402, 1404 as two straight lines when viewed from a distance. It is understood although only green vertical line(s) are displayed in the examples of FIGS. 12-14, red vertical line(s) can also be displayed in the same manner as shown in the examples of FIGS. 12-14 by turning on half and/or all of the red subpixels in the corresponding subpixel groups.

Figure 15:
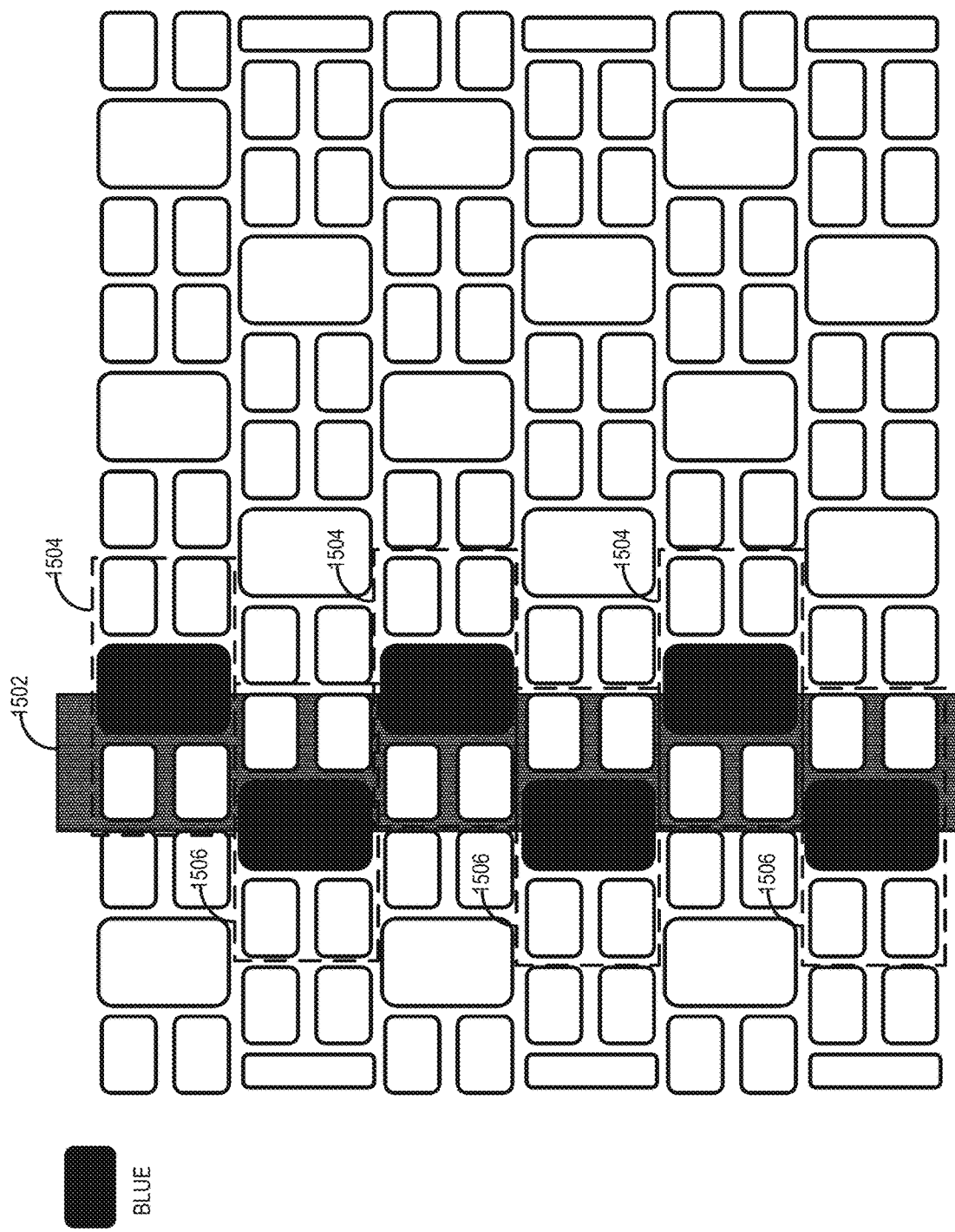
FIG. 15 is a depiction of displaying a single blue vertical line on a display using the subpixel arrangement shown in FIG. 4 in accordance with one embodiment set forth in the disclosure.

In FIG. 15, a single blue vertical line 1502 is displayed by fully turning on the blue subpixels (i.e., the value of the blue subpixel is 255) in the corresponding subpixel groups 1504, 1506. For example, in each odd row of subpixels, the blue subpixels in the corresponding subpixel groups 1504 are turned on; in each even row of subpixels, the blue subpixels in the corresponding subpixel groups 1506 are turned on. It is understood that because of the staggered arrangement between adjacent rows, the blue subpixels in adjacent rows are not strictly aligned in the vertical direction and thus, the single blue vertical line 1502 in this example is not a straight line. However, the human vision system would consider the single blue vertical line 1502 as a straight line when viewed from a distance.

Figure 16:
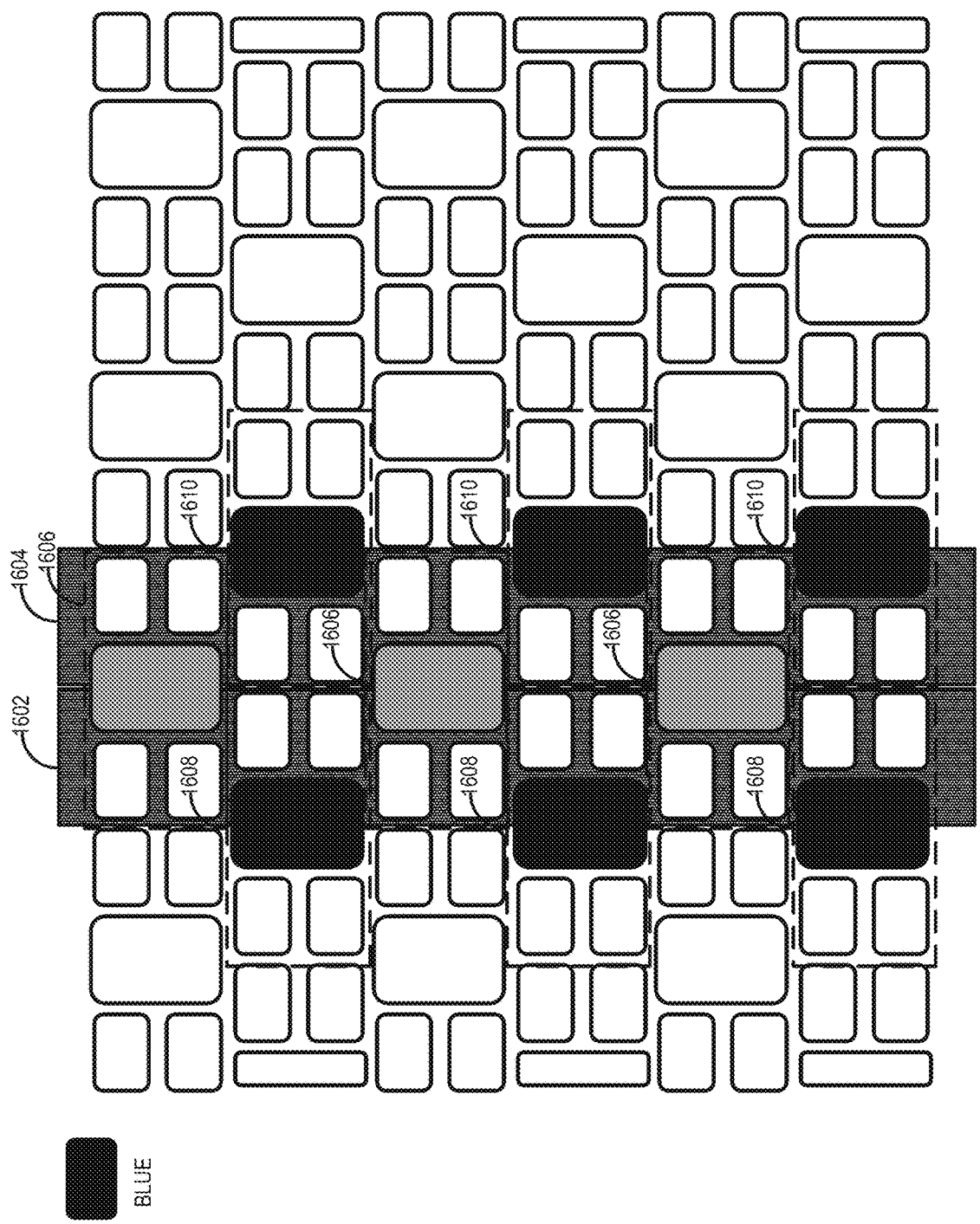
FIG. 16 is a depiction of displaying two adjacent blue vertical lines on a display using the subpixel arrangement shown in FIG. 4 in accordance with one embodiment set forth in the disclosure.

In FIG. 16, two adjacent blue vertical lines 1602, 1604 are displayed by fully or partially turning on the blue subpixels in the corresponding subpixel groups 1606, 1608, 1610. In each odd row, the blue subpixels in the corresponding subpixel groups 1606 are partially turned on (i.e., the value of the blue subpixel is larger than 0 and smaller than 255). In each even row of subpixels, the blue subpixels in the two adjacent subpixel groups 1608, 1610 are fully turned on (i.e., the value of the blue subpixel is 255). Similarly, the human vision system would consider the two adjacent blue vertical lines 1602, 1604 as two straight lines when viewed from a distance.

Figure 17:
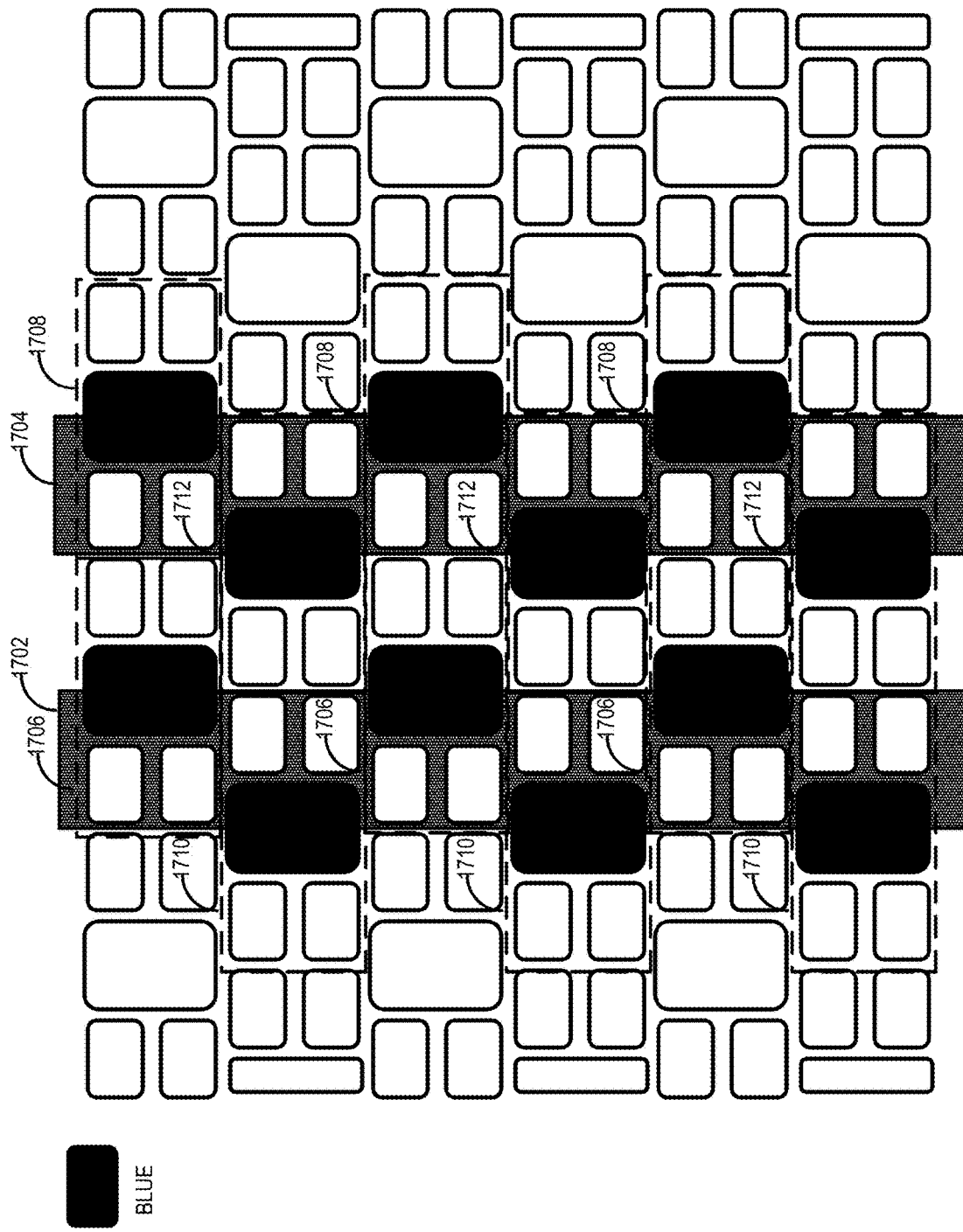
FIG. 17 is a depiction of displaying two separate blue vertical lines on a display using the subpixel arrangement shown in FIG. 4 in accordance with one embodiment set forth in the disclosure.

In FIG. 17, two separate blue vertical lines 1702, 1704 are displayed by fully turning on the blue subpixels (i.e., the value of the blue subpixel is 255) in the corresponding subpixel groups 1706, 1708, 1710, 1712. In each odd row of subpixels, the blue subpixels in the two adjacent subpixel groups 1706, 1708 are turned on; in each even row of subpixels, the blue subpixels in the two adjacent subpixel groups 1710, 1712 are turned on. Similarly, the human vision system would consider the two separate blue vertical lines 1702, 1704 as two straight lines when viewed from a distance.

Figure 18:
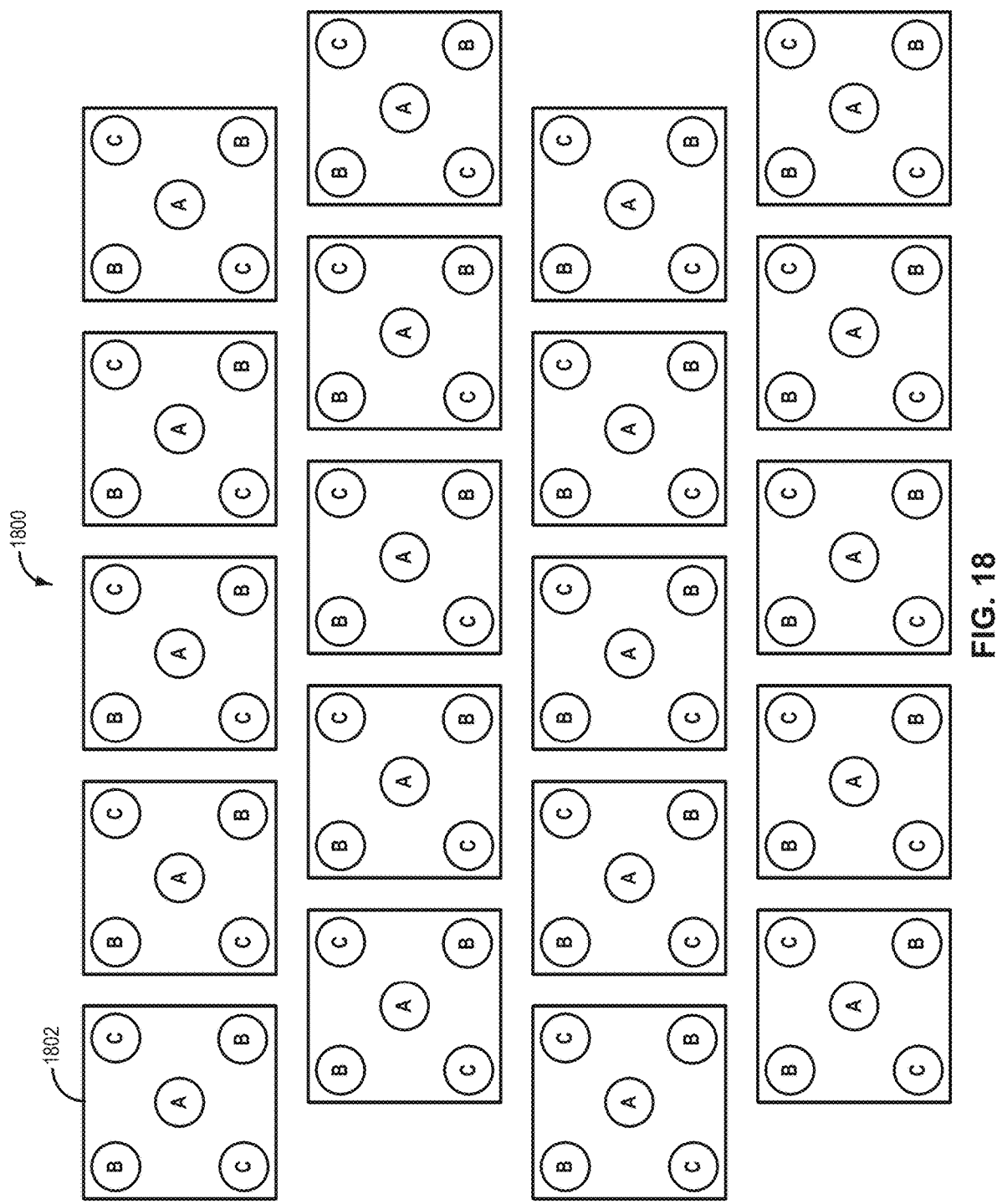
FIG. 18 is a depiction of a subpixel arrangement of an LED lamp display in accordance with one embodiment set forth in the disclosure.

FIG. 18 depicts a subpixel arrangement of an LED lamp display in accordance with one embodiment set forth in the disclosure. FIG. 18 may be, for example, a plan view of the display 102 and depicts one example of the subpixel arrangements of the display 102. The display 102 in this example is an LED lamp display, such as a billboard display with an array 1800 of LED lamps 1802. Each LED lamp 1802 may be considered as a subpixel group, which repeats itself horizontally in each row of the array 1800. Similar to the arrangement of subpixel groups 302 in FIG. 3, LED lamps 1802 in each row of the array 1800 are staggered relative to LED lamps 1802 in an adjacent row of the array 1800 by, for example, half of the width of an LED lamp 1802. LED lamps 1802 in interval rows are aligned along the vertical direction. Each LED lamp 1802 in this embodiment is an assembly/packaging of five LEDs which can be individually controlled. Each LED lamp 1802 includes one LED in a first color A, two LEDs in a second color B, and two LEDs in a third color C. A, B, and C in FIG. 18 denote three different colors, such as but not limited to, red, green, blue, yellow, cyan, or magenta. In one example, the first color A is blue, and the second and third colors B, C are green and red. When all the LEDs in an LED lamp 1802 are turned on, the LED lamp 1802 emits the white light.

In this embodiment, the five LEDs A, B, B, C, and C are arranged in the same pattern in each LED lamp 1802. For each LED lamp 1802, the two LEDs in the second color B, are on different sides of the LED in the first color A along the horizontal direction, and the two LEDs in the third color C are on different sides of the LED in the first color A along the horizontal direction as well. In other words, in each LED lamp 1802, one LED B and one LED C are in the left part of the LED lamp 1802, the other LED B and the other LED C are in the right part of the LED lamp 1802, and the LED A is in the middle of the LED lamp 1802.

In this embodiment, in each LED lamp 1802, one LED B is aligned with one LED C along the vertical direction on the left side of the LED A, and the other LED B is aligned with the other LED C along the vertical direction on the right side of the LED A. Different from the example shown in FIG. 3, in this embodiment, one LED B is aligned with one LED C along the horizontal direction, and the other LED B is aligned with the other LED C along the horizontal direction. In other words, the two LEDs in the same colors (i.e., B and B, or C and C) are arranged flush with each other along the diagonal direction, and the two LEDs in the different colors (i.e., B and C) are arranged flush with each other vertically or horizontally.

Figure 19:
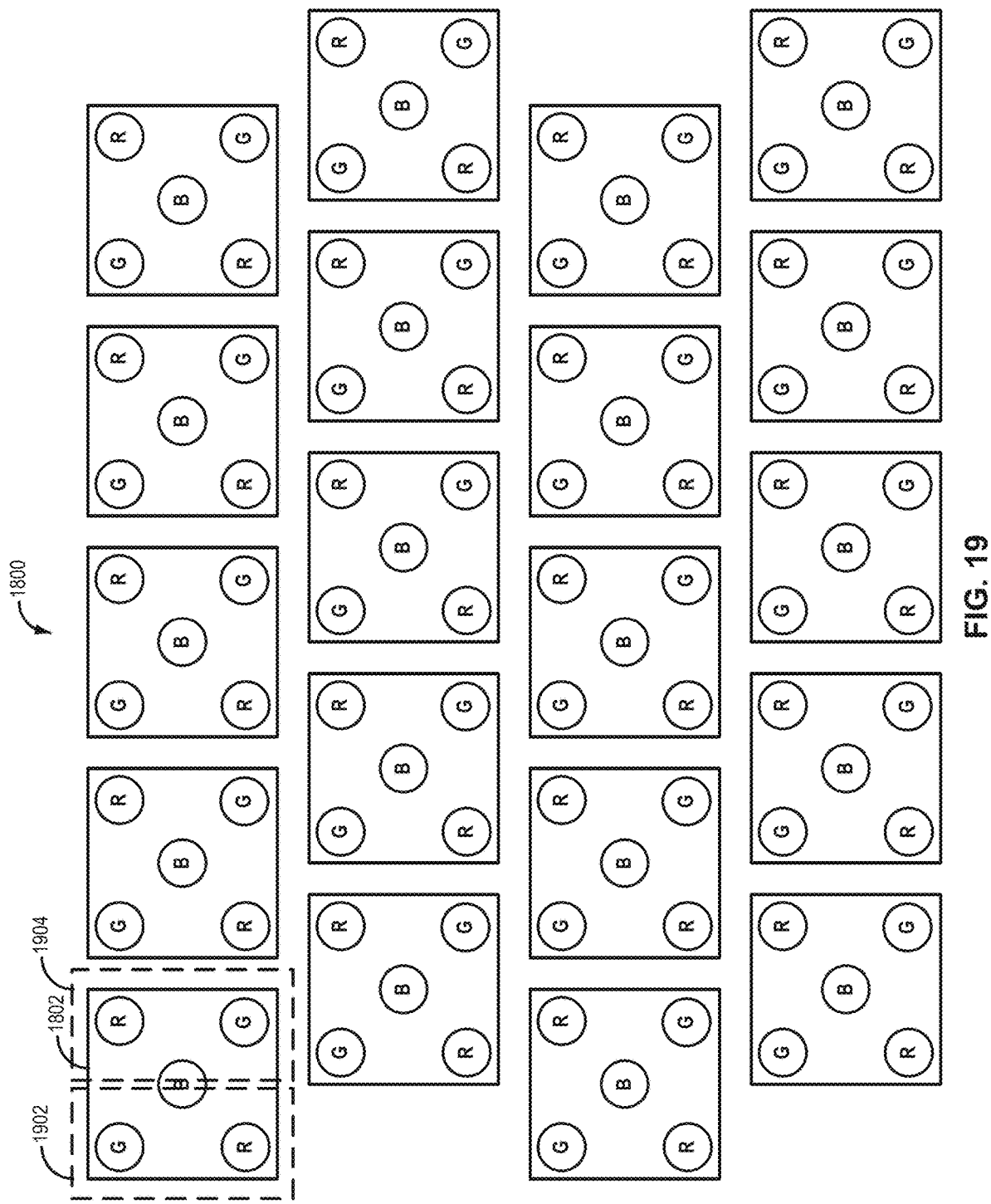
FIG. 19 is a schematic diagram of pixel division for the subpixel arrangement shown in FIG. 18 in accordance with one embodiment set forth in the disclosure.

FIG. 19 illustrates one example of pixel division for the subpixel arrangement shown in FIG. 18. In this example, each LED lamp 1802 is divided into two pixels 1902, 1904 such that, each of the two pixels 1902, 1904 includes one of the two LEDs in the second color (e.g., G) and one of the two LEDs in the third color (e.g., R), and that the LED in the first color (e.g., B) is shared by the two pixels 1902, 1904. As shown in FIG. 19, the LED lamp 1802 is evenly divided through the middle of the blue LED into a left part corresponding to one pixel 1902, and a right part corresponding to another pixel 1904. The pixel 1902 includes one green LED, one red LED, and the left part of the blue LED; the pixel 1904 includes one red LED, one green LED, and the right part of the blue LED. That is, each blue LED on the display is shared by two adjacent pixels. It is understood that, in other examples, each LED lamp may include one red LED, two green LEDs, and two blue LEDs, and the red LED is in the middle of the LED lamp and shared by two adjacent pixels.

Figure 20:
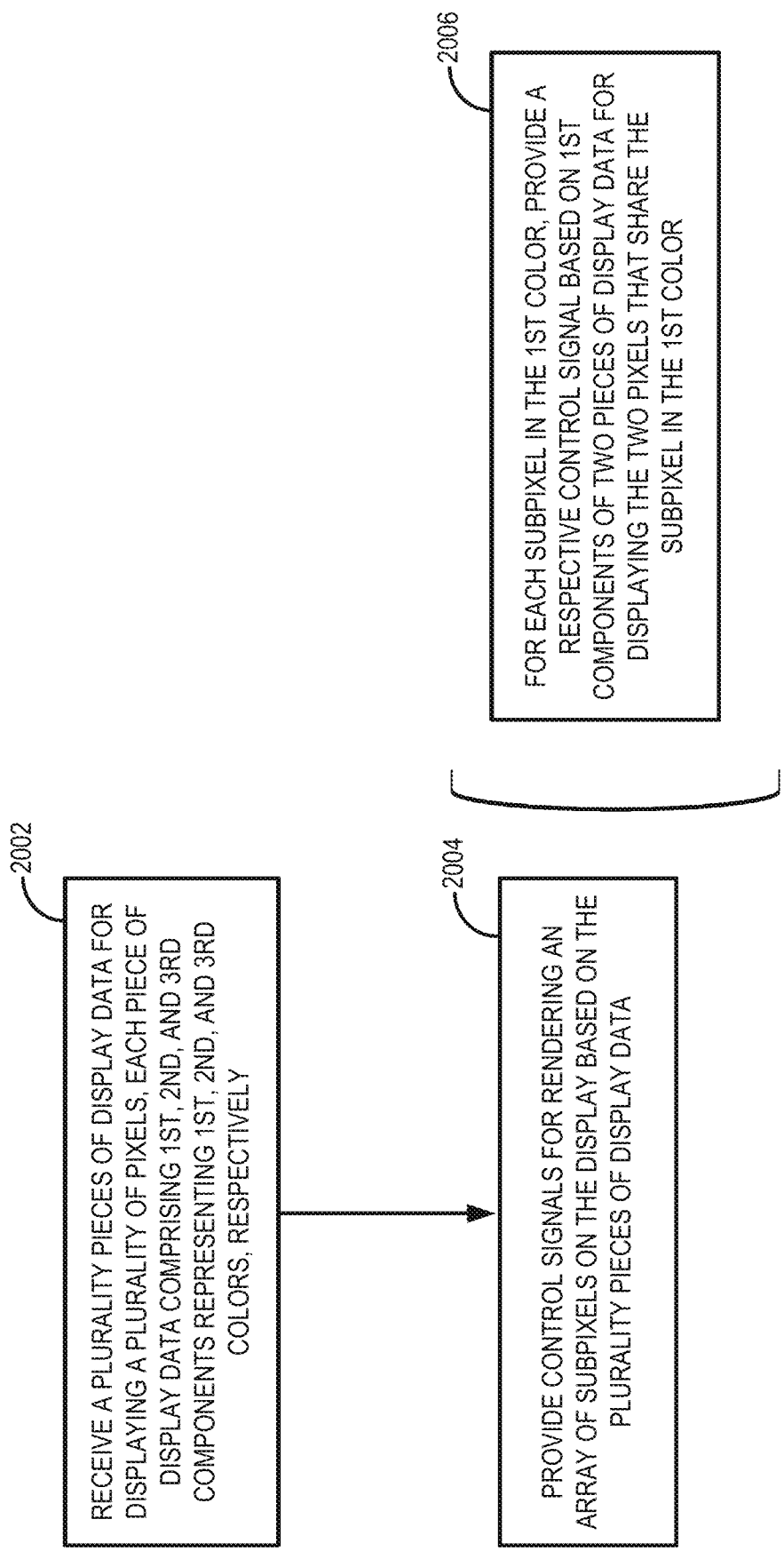
FIG. 20 is a flow chart illustrating a method for rendering subpixels of the display shown in FIG. 1 in accordance with one embodiment set forth in the disclosure.

FIG. 20 depicts one example of a method for subpixel rendering on a display. The method may be implemented by the control logic 104 of the apparatus 100 or on any other suitable machine having at least one processor. The control logic 104 may include logic and module(s) to perform each step of the method described below. The "logic" and "module" referred to herein are defined as any suitable software, hardware, firmware, or any suitable combination thereof that can perform the desired function, such as programmed processors, discrete logic, for example, state machine, to name a few. The method for rendering subpixels may be applied to any one of the subpixel arrangements provided above in FIGS. 3-19 or any other suitable subpixel arrangement in accordance with the present disclosure.

Figure 21:
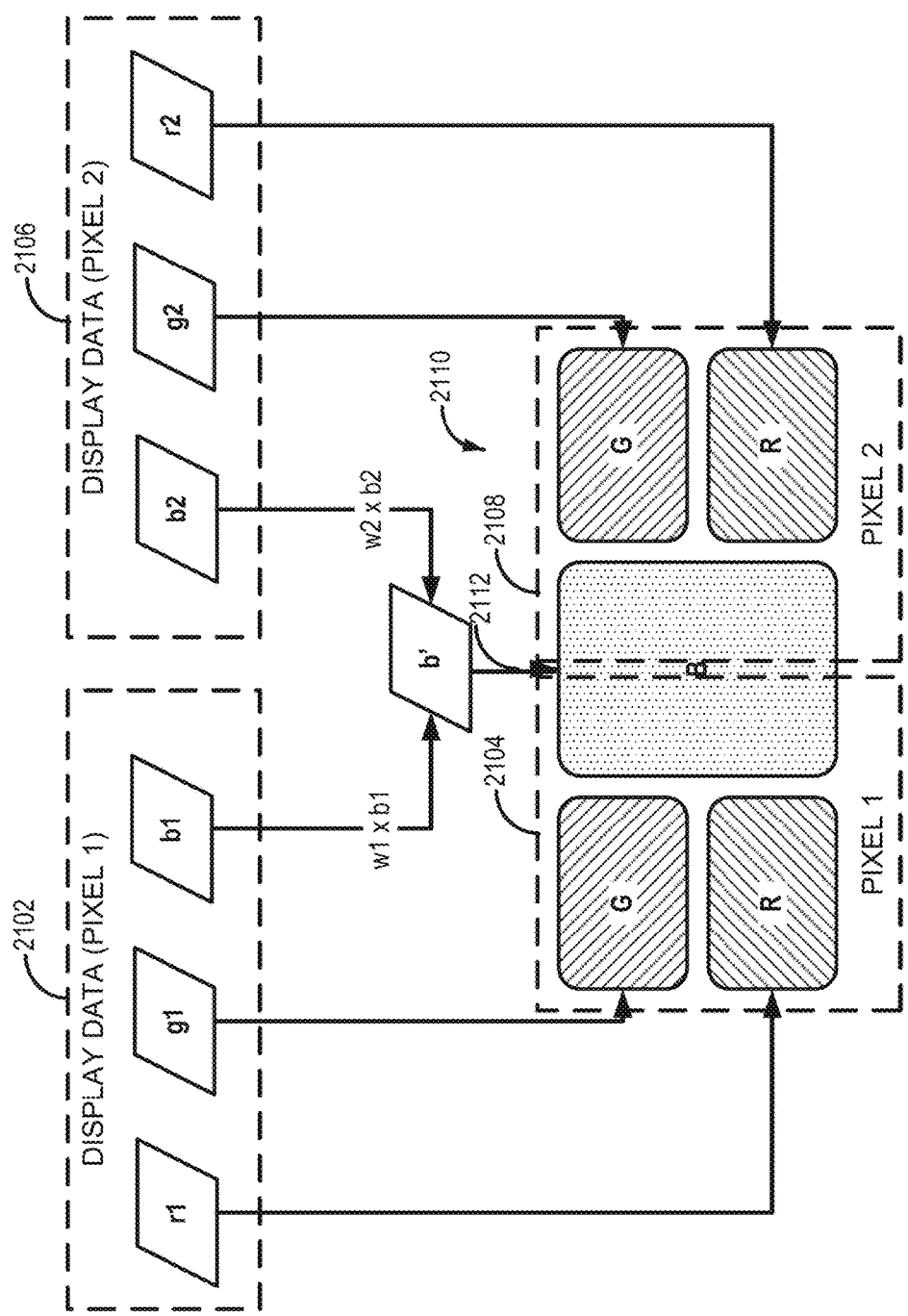
FIG. 21 is a schematic diagram illustrating an algorithm for implementing the method shown in FIG. 20 in accordance with one embodiment set forth in the disclosure.

Beginning at 2002, a plurality pieces of display data for displaying a plurality of pixels are received. Each piece of display data includes a first, a second, and a third components representing a first, a second, and a third colors, respectively. In this example, the first color is blue, and the second and third colors are green and red. As noted above, the display data 106 may be programmed at the pixel level and thus and include three components of data for rendering three subpixels with different colors (e.g., three primary colors of red, green, and blue) for each pixel on the display 102. Referring now to FIG. 21, for example, a first piece of display data 2102 for a first pixie 2104 may be represented as (r1, g1, b1). Each of the three components r1, g1, b1 may have a value from 0 to 255. When all the three components are set as 255, the three subpixels in the first pixel 2104 are fully turned on, and the pixel presents the white color; when all the three components are set as 0, the three subpixels in the first pixel 2104 are fully turn off, and the first pixel 2104 presents the black color. Similarly, a second piece of display data 2106 of a second pixel 2108 that is adjacent to the first pixel 2104 in the same row may be represented as (r2, g2, b2). As noted above, the first and second pixels 2104, 2108 are divided from the same subpixel group 2110 and share the blue subpixel B in the subpixel group 2110. Each of the pixels 2104, 2108 further includes a green subpixel G and a red subpixel R.

Referring back to FIG. 20, at 2004, control signals 108 for rendering the array of subpixel groups on the display 102 are provided based on the plurality pieces of display data 106. In one embodiment, at 2006, for each subpixel in the first color, a respective control signal is provided based on first components of two pieces of display data for displaying the two pixels that share the subpixel in the first color. In one example, the respective control signal is obtained by calculating the weighted average of the first components of the two pieces of display data. Referring now to FIG. 21, the control signal 2112 for driving the blue subpixel is obtained by calculating the weighted average of the blue components of the first and second pieces of display data 2102, 2106. For example, the calculation may be performed using the following equations:

$$b' = w1 \times b1 + w2 \times b2 \qquad (1)$$

where b' is the value of the control signal 2112 for the blue subpixel, b1, b2 are the values of the blue components of the two pieces of display data 2102, 2106, respectively, and w1, w2 are weights of b1, b2, respectively. In one example, both w1 and w2 equal to ½, and b' is the average of b1 and b2. It is understood that the values of w1, w2 may be different in other examples. As to the green and red subpixels, the corresponding components in the corresponding pixels may be used directly to provide the control signals for driving the green and red subpixels. As shown in FIG. 21, g1 is used to provide the control signal for the green subpixel in the first pixel 2104, and r1 is used to provide the control signal for the red subpixel in the first pixel 2104. Similarly, g2 is used to provide the control signal for the green subpixel in the second pixel 2108, and r2 is used to provide the control signal for the red subpixel in the second 2108. It is understood that, in other examples, the first color may be red, and the weighted average of the red components of the first and second pieces of display may be calculated in the same manner as described above.

Figure 22:
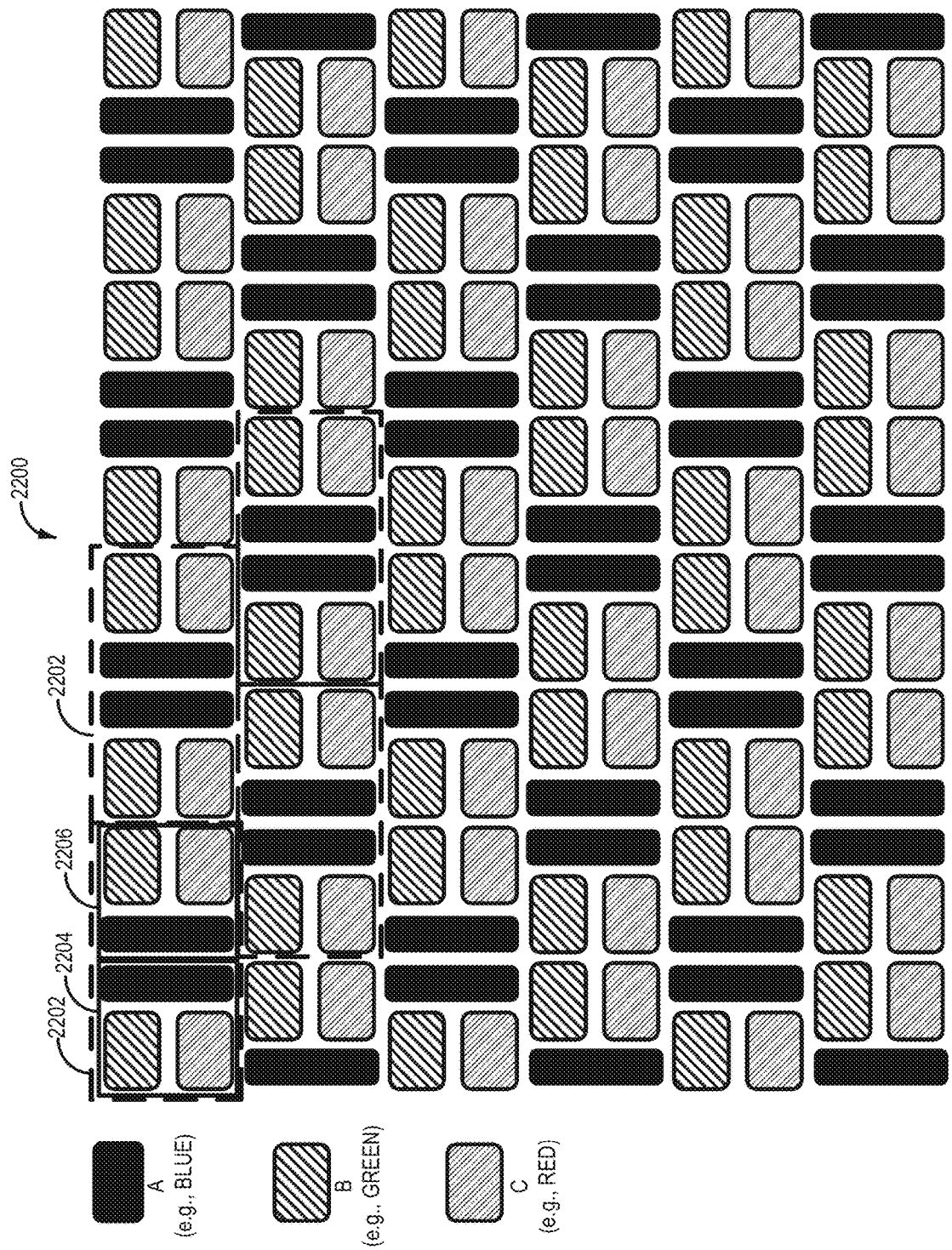
FIG. 22 is a depiction of another subpixel arrangement of an OLED display in accordance with one embodiment set forth in the disclosure.

FIG. 22 depicts another example of subpixel arrangement of an OLED display in accordance with one embodiment set forth in the disclosure. FIG. 22 may be, for example, a plan view of the display 102 and depicts one example of the subpixel arrangements of the display 102. The display 102 includes an array 2200 of subpixel groups 2202. Each subpixel group 2202 in this embodiment includes six subpixels: two subpixels in a first color A, two subpixels in a second color B, and two subpixels in a third color C. A, B, and C in FIG. 22 denote three different colors, such as but not limited to, red, green, blue, yellow, cyan, magenta, or white. In one example, the first color A is blue, and the second and third colors B, C are green and red. Subpixel groups 2202 in each row of the array 2200 are repeated along the horizontal direction. Subpixel groups 2202 in each row of the array 2200 are staggered relative to subpixels groups 2202 in an adjacent row of the array 2200. In other words, subpixel groups 2202 in adjacent rows are staggered along the horizontal direction. In this embodiment, subpixel groups 2202 in interval rows are aligned along the vertical direction. That is, subpixel groups 2202 in each odd row are aligned along the vertical direction, and subpixel groups 2202 in each even row are aligned along the vertical direction. Stated in another way, subpixel groups 2202 in each row are arranged repeatedly, and the subpixel groups 2202 in adjacent rows are arranged shifted from each other by, for example, ½ of the repeat pitch. In another example, the first color A is red, and the second and third colors B, C are green and blue.

In this embodiment, the six subpixels A, A, B, B, C, and C are arranged in the same pattern in each subpixel group 2202. For each subpixel group 2202, the two subpixels in the second color B are on different sides of the two subpixel in the first color A along the horizontal direction, and the two subpixels in the third color C are on different sides of the two subpixels in the first color A along the horizontal direction as well. That is, in the horizontal direction, the two subpixels A are between the two subpixels B, and also between the two subpixels C. In other words, in each subpixel group 2202, one subpixel B and one subpixel C are in the left part of the subpixel group 2202, the other subpixel B and the other subpixel C are in the right part of the subpixel group 2202, and the two subpixels A are in the middle of the subpixel group 2202. In each subpixel group 2202, the two subpixels B have the same size and shape, and the two subpixels C have the same size and shape as well.

In this embodiment, in each subpixel group 2202, one subpixel B is aligned with one subpixel C along the vertical direction on the left side of the two subpixels A, and the other subpixel B is aligned with the other subpixel C along the vertical direction on the right side of the two subpixels A. The two subpixels B are aligned with each other along the horizontal direction, and the two subpixels C are aligned with each other along the horizontal direction as well. In other words, the two subpixels in the same colors (i.e., B and B, or C and C) are arranged flush with each other horizontally, and the two subpixels in the different colors (i.e., B and C) are arranged flush with each other vertically. It is understood that even if two subpixels have different sizes and/or shapes, they are considered as being "aligned" if the centers of the two subpixels are aligned vertically or horizontally.

In this embodiment, each subpixel group 2202 is divided into two pixels 2204, 2206 such that each of the two pixels 2204, 2206 includes one of the two subpixels in the first color A, one of the two subpixels in the second color B, and one of the two subpixels in the third color C. As shown in FIG. 22, the subpixel group 2202 is evenly divided into a left part corresponding to one pixel 2204 and a right part corresponding to another pixel 2206.

In this embodiment, each subpixel corresponds to an OLED, and for each subpixel group 2202, the two OLEDs in the first color (e.g., blue or red) have the same shape and size and share the same organic light-emitting layer in the similar manner as discussed above with respect to FIG. 5. Each of the OLEDs in this embodiment has a substantially rectangular shape. However, it is understood that the shape of each subpixel in other examples may vary. Other shapes of the subpixels include, but are not limited to, substantially round, triangle, square, pentagon, hexagon, heptagon, octagon, or any other suitable shape. It is understood that the subpixels are not limited to OLEDs and may be, for example, LEDs of a billboard display with LED lamps or any other suitable display devices as known in the art.

Figure 23:
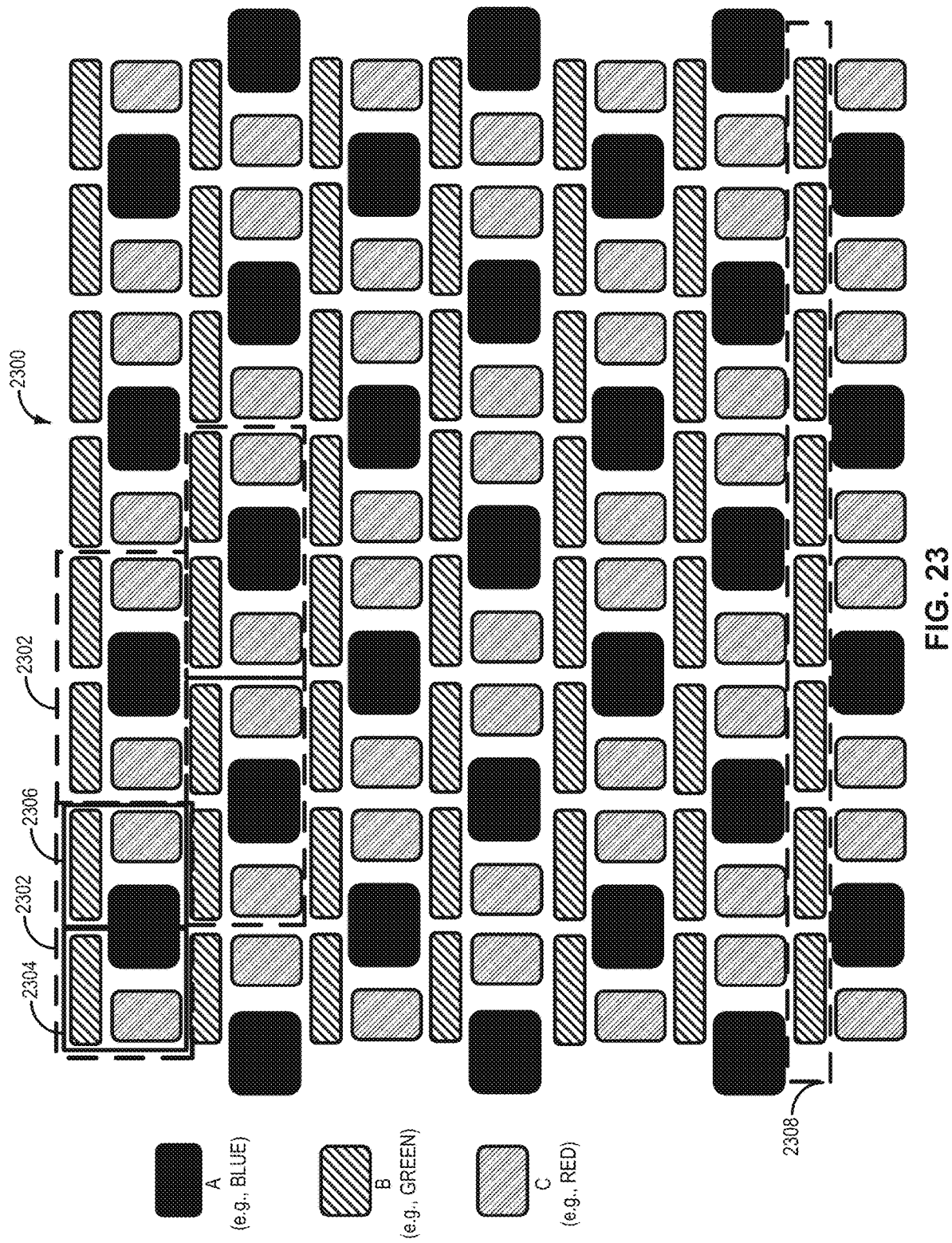
FIG. 23 is a depiction of still another subpixel arrangement of an OLED display in accordance with one embodiment set forth in the disclosure.

FIG. 23 depicts still another example of subpixel arrangement of an OLED display in accordance with one embodiment set forth in the disclosure. FIG. 23 may be, for example, a plan view of the display 102 and depicts one example of the subpixel arrangements of the display 102. The display 102 includes an array 2300 of subpixel groups 2302. Each subpixel group 2302 in this embodiment includes five subpixels: one subpixel in a first color A, two subpixels in a second color B, and two subpixels in a third color C. A, B, and C in FIG. 23 denote three different colors, such as but not limited to, red, green, blue, yellow, cyan, magenta, or white. In one example, the first color A is blue, and the second and third colors B, C are green and red. Subpixel groups 2302 in each row of the array 2300 are repeated along the horizontal direction. Subpixel groups 2302 in each row of the array 2300 are staggered relative to subpixels groups 2302 in an adjacent row of the array 2300. In other words, subpixel groups 2302 in adjacent rows are staggered along the horizontal direction. In this embodiment, subpixel groups 2302 in interval rows are aligned along the vertical direction. That is, subpixel groups 2302 in each odd row are aligned along the vertical direction, and subpixel groups 2302 in each even row are aligned along the vertical direction. Stated in another way, subpixel groups 2302 in each row are arranged repeatedly, and the subpixel groups 2302 in adjacent rows are arranged shifted from each other by, for example, ½ of the repeat pitch. In another example, the first color A is red, and the second and third colors B, C are green and blue.

In this embodiment, the five subpixels A, B, B, C, and C are arranged in the same pattern in each subpixel group 2302. For each subpixel group 2302, the two subpixels in the second color B are on the same side of the subpixel in the first color A along the vertical direction. In other words, the two subpixels B are above the subpixel A in each subpixel group 2302. The two subpixels in the third color C are on different sides of the subpixel in the first color A along the horizontal direction. That is, in the horizontal direction, the subpixel A is between the two subpixels C. In each subpixel group 2302, the two subpixels B have the same size and shape, and the two subpixels C have the same size and shape as well. However, in this embodiment, the size and shape of the subpixel B may be different from the size and shape of the subpixel C.

In this embodiment, in each subpixel group 2302, the two subpixels B are aligned with each other along the horizontal direction, and the two subpixels C are aligned with each other along the horizontal direction as well. In other words, the two subpixels in the same colors (i.e., B and B, or C and C) are arranged flush with each other horizontally. It is understood that even if two subpixels have different sizes and/or shapes, they are considered as being "aligned" if the centers of the two subpixels are aligned vertically or horizontally.

In this embodiment, each subpixel group 2302 is divided into two pixels 2304, 2306 such that each of the two pixels 2304, 2306 includes one of the two subpixels in the second color B, one of the two subpixels in the third color C, and shares the subpixel in the first color A. As shown in FIG. 23, the subpixel group 2302 is evenly divided into a left part corresponding to one pixel 2304 and a right part corresponding to another pixel 2306.

In this embodiment, each subpixel corresponds to an OLED, and in each subpixel group 2302, the OLED in the third color C shares the same organic light-emitting layer with a respective OLED in the third color C in the adjacent subpixel group 2302 in the same row of the array 2300. In this embodiment, in each subpixel group 2302, the two OLEDs in the second color B share the same organic light-emitting layer in the similar manner as discussed above with respect to FIG. 5. In each subpixel group 2302, the OLED in the second color B also shares the same organic light-emitting layer with a respective OLED in the second color B in the adjacent subpixel group 2302 in the same row of the array 2300. That is, in this embodiment, all OLEDs in the second color B in the same row of the array 2300 share the same organic light-emitting layer 2308, which is fabricated through a "slit" opening on the evaporation mask.

Each of the OLEDs in this embodiment has a substantially rectangular shape. However, it is understood that the shape of each subpixel in other examples may vary. Other shapes of the subpixels include, but are not limited to, substantially round, triangle, square, pentagon, hexagon, heptagon, octagon, or any other suitable shape. It is understood that the subpixels are not limited to OLEDs and may be, for example, LEDs of a billboard display with LED lamps or any other suitable display devices as known in the art.

Aspects of the method for subpixel rendering on a display, as outlined above, may be embodied in programming. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives and the like, which may provide storage at any time for the software programming.

All or portions of the software may at times be communicated through a network such as the Internet or various other telecommunication networks. Such communications, for example, may enable loading of the software from one computer or processor into another. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-volatile storage media include, for example, optical or magnetic disks, such as any of the storage devices in any computer(s) or the like, which may be used to implement the system or any of its components as shown in the drawings. Volatile storage media include dynamic memory, such as a main memory of such a computer platform. Tangible transmission media include coaxial cables; copper wire and fiber optics, including the wires that form a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

The above detailed description of the disclosure and the examples described therein have been presented for the purposes of illustration and description only and not by limitation. It is therefore contemplated that the present disclosure cover any and all modifications, variations or equivalents that fall within the spirit and scope of the basic underlying principles disclosed above and claimed herein.

What is claimed is:

1. A display having n pixels, comprising:
   n/2 organic light-emitting layers in a first color;
   n/2 organic light-emitting layers in a second color; and
   n/2 organic light-emitting layers in a third color, wherein
      each of the n pixels comprises ½ of an organic light-emitting layer in the first color, ½ of an organic light-emitting layer in the second color, and ½ of an organic light-emitting layer in the third color;
   each of the organic light-emitting layers in the first color is shared by two organic light-emitting diodes (OLEDs) in the first color; and
   each of the organic light-emitting layers in the second color is in only one OLED in the second color.

2. The display of claim 1, wherein each of the organic light-emitting layers in the third color is shared by two OLEDs in the third color.

3. The display of claim 1, wherein each of the light-emitting layers in the first color is configured to receive current between each of two sets of anodes and cathodes.

4. The display of claim 1, wherein each of the light-emitting layers in the second color is configured to receive current between only one set of anode and cathode.

5. The display of claim 1, wherein the first color is green or red.

6. The display of claim 1, wherein the second color is blue.

7. An apparatus comprising:
a display comprising an array of subpixel groups arranged in rows and columns, wherein each of the subpixel groups comprises one subpixel in a first color, two subpixels in a second color, and two subpixels in a third color;
each of the subpixel groups is divided into two pixels such that each of the two pixels includes one of the two subpixels in the second color and one of the two subpixels in the third color, and the subpixel in the first color is shared by the two pixels, wherein the sharing of the pixels comprises an organic light-emitting layer biased with one set of electrodes;
subpixels in the first color are aligned in a row direction and are staggered in a column direction by one pixel;
subpixels in the second color are aligned in the row direction and are staggered in the column direction by ½ pixel; and
subpixels in the third color are aligned in the row direction and are staggered in the column direction by ½ pixel.

8. The apparatus of claim 7, wherein the first color is blue.

9. The apparatus of claim 7, wherein the second and third colors are green and red, respectively.

10. The display of claim 1, wherein in each of the n pixels, one of the n/2 organic light-emitting layers in the first color and the n/2 organic light-emitting layers in the third color is above the other along a vertical direction.

11. The display of claim 1, wherein in adjacent pixels sharing each of the organic light-emitting layers in the second color, the organic light-emitting layer in the second color has a larger size than each of the organic light-emitting layers in the first and second colors.

12. The display of claim 1, wherein in each of the n pixels, the n/2 organic light-emitting layers in the first color and the n/2 organic light-emitting layers in the third color are on the same side of the n/2 organic light-emitting layers in the second color.

13. The apparatus of claim 7, wherein a light-emitting layer of the subpixel in the first color is shared by the two pixels.

* * * * *